(12) United States Patent
Chen

(10) Patent No.: US 11,887,981 B2
(45) Date of Patent: Jan. 30, 2024

(54) LATERAL SURGE PROTECTION DEVICES

(71) Applicant: SEMICONDUCTOR COMPONENTS INDUSTRIES, LLC, Phoenix, AZ (US)

(72) Inventor: Yupeng Chen, San Jose, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 31 days.

(21) Appl. No.: 16/948,817

(22) Filed: Oct. 1, 2020

(65) Prior Publication Data
US 2021/0118870 A1    Apr. 22, 2021

Related U.S. Application Data

(60) Provisional application No. 62/924,651, filed on Oct. 22, 2019.

(51) Int. Cl.
*H01L 27/02* (2006.01)
*H01L 27/06* (2006.01)
*H01L 27/07* (2006.01)

(52) U.S. Cl.
CPC ...... *H01L 27/0262* (2013.01); *H01L 27/0259* (2013.01); *H01L 27/067* (2013.01); *H01L 27/0722* (2013.01)

(58) Field of Classification Search
CPC ........ H01L 27/0259–27/0262; H01L 29/0808; H01L 29/1008; H01L 29/6625; H01L 27/067; H01L 27/0722; H01L 27/0783
See application file for complete search history.

(56) References Cited

U.S. PATENT DOCUMENTS

| | | | |
|---|---|---|---|
| 2003/0213971 A1 | 11/2003 | Yu | |
| 2009/0032906 A1* | 2/2009 | Ostermann | H01L 27/0259 257/539 |
| 2010/0044834 A1* | 2/2010 | Park | H01L 27/0259 257/572 |
| 2011/0147794 A1 | 6/2011 | Gauthier, Jr. et al. | |
| 2012/0025350 A1 | 2/2012 | Lin et al. | |
| 2013/0134550 A1* | 5/2013 | Tanaka | H01L 29/7322 257/526 |
| 2014/0159108 A1* | 6/2014 | Marreiro | H01L 27/0248 257/140 |
| 2015/0041954 A1 | 2/2015 | Chen et al. | |
| 2016/0071962 A1* | 3/2016 | Senapati | H01L 29/41708 257/586 |
| 2016/0276827 A1* | 9/2016 | Coyne | H01L 27/0259 |
| 2017/0077082 A1 | 3/2017 | Marreiro et al. | |
| 2019/0067269 A1 | 2/2019 | Chen et al. | |
| 2020/0098741 A1* | 3/2020 | Zeng | H01L 29/41716 |

* cited by examiner

*Primary Examiner* — Wasiul Haider
(74) *Attorney, Agent, or Firm* — Brake Hughes Bellermann LLP

(57) ABSTRACT

In a general aspect, an apparatus can include a semiconductor layer of a first conductivity type and a lateral bipolar device disposed in the semiconductor layer. The apparatus can further include an isolation trench disposed in the semiconductor layer in a base region of the lateral bipolar device. The isolation trench can be disposed between an emitter implant of the lateral bipolar device and a collector implant of the lateral bipolar device. The emitter implant and the collector implant can be of a second conductivity type, opposite the first conductivity type.

20 Claims, 16 Drawing Sheets

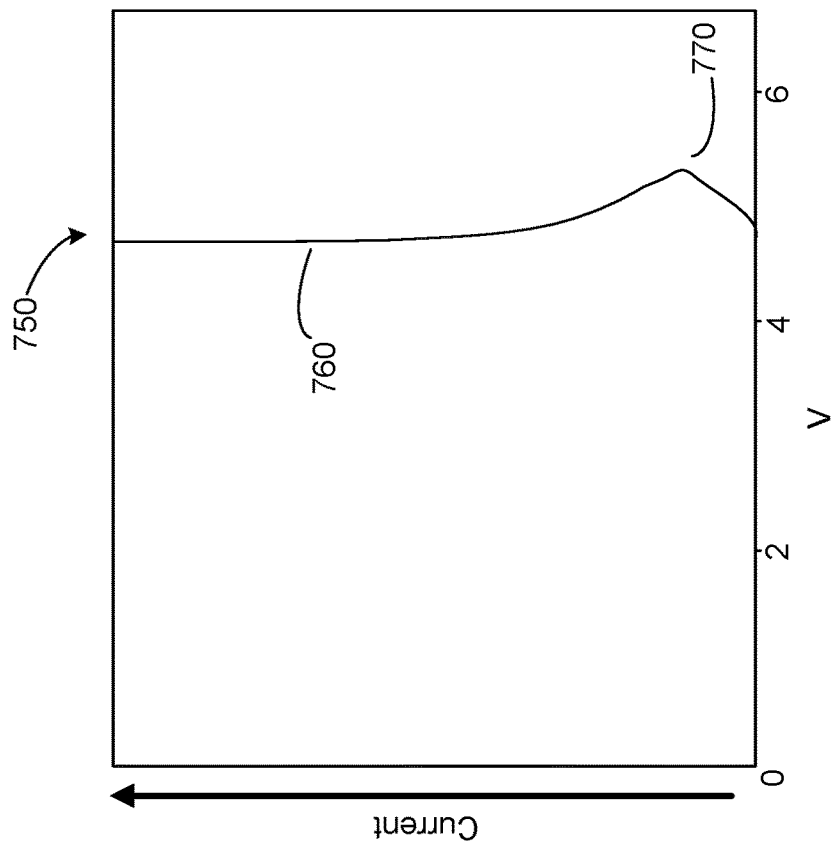
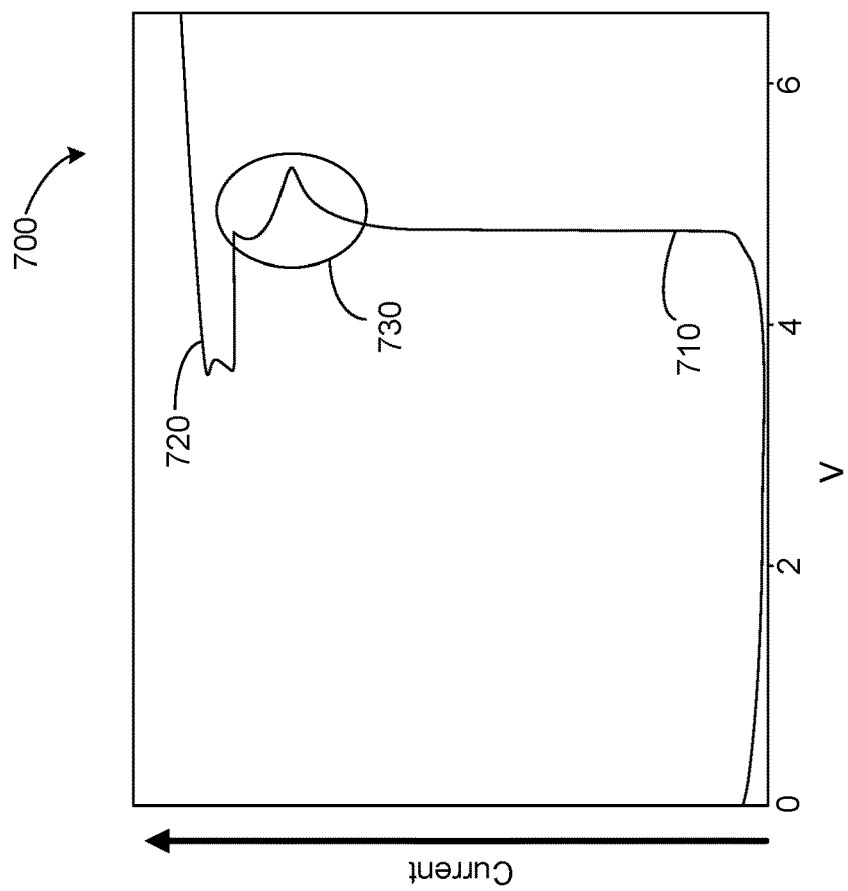
FIG. 7B
FIG. 7A

LATERAL SURGE PROTECTION DEVICES

RELATED APPLICATION

This application claims priority to and the benefit of U.S. Provisional Application No. 62/924,651, filed Oct. 22, 2019, which is incorporated herein by reference in its entirety.

BACKGROUND

Semiconductor processing technologies, and related packaging technologies continue to scale to smaller dimensions, which presents challenges in achieving electrostatic discharge (ESD) and electrical (voltage and/or current) surge protection target specifications. For instance, miniaturized packages and semiconductor devices used for mobile applications must still maintain acceptable ESD and electrical surge protection (collectively surge protection) performance, even as their dimensions scale. Current protection approaches cannot achieve sufficient electrical surge protection in such miniaturized packages, and also struggle to provide low enough residual voltage during surge events to prevent damage (e.g., thermal damage) to associated semiconductor devices, particularly for semiconductor devices used in power applications (e.g., devices implemented in USB type-C mobile power applications with fast charging).

SUMMARY

In a general aspect, an apparatus can include a semiconductor layer of a first conductivity type and a lateral bipolar device disposed in the semiconductor layer. The apparatus can further include an isolation trench disposed in the semiconductor layer in a base region of the lateral bipolar device. The isolation trench can be disposed between an emitter implant of the lateral bipolar device and a collector implant of the lateral bipolar device. The emitter implant and the collector implant can be of a second conductivity type, opposite the first conductivity type.

BRIEF DESCRIPTION OF THE DRAWINGS

FIGS. 7A, 7B, and 8 are graphs illustrating operation of implementations of the device of FIG. 4.

DETAILED DESCRIPTION

Figure 1A:
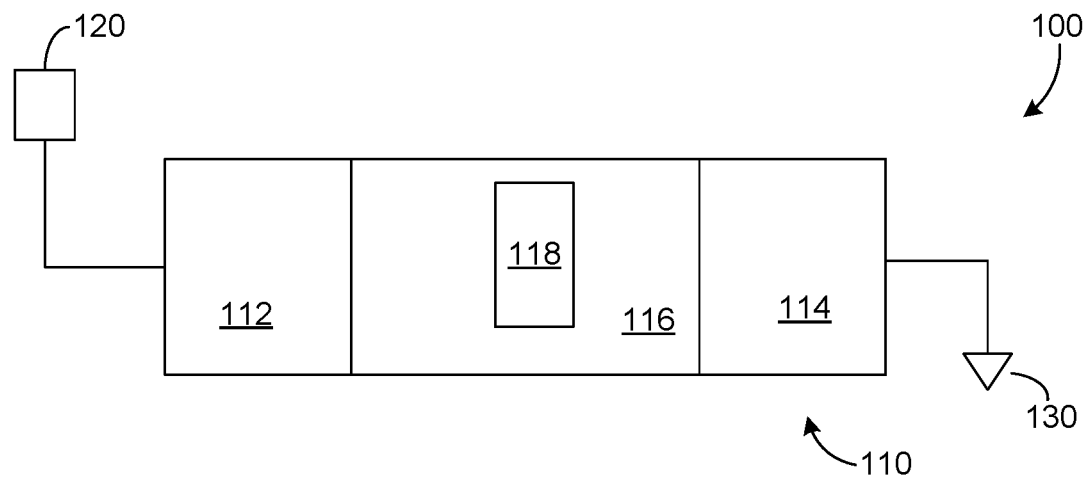
FIGS. 1A and 2A are block diagrams schematically illustrating lateral surge protection devices.

In the following detailed description (and in the accompanying drawings) a number of example implementations of lateral surge protection devices (and their operation) are described and illustrated. The illustrated devices include a number of similar aspects, as well as a number of variations from one illustrated implementation to another. In the implementations disclosed herein, a lateral surge protection device can include an isolation trench that is disposed in a base (e.g., a base region) of a lateral (e.g., parasitic) bipolar device (e.g., a bipolar transistor, a bipolar silicon-controlled rectifier (SCR), etc.) used for electrical surge protection.

In the example implementations described herein, such an isolation trench can be configured to regulate (e.g., tune, alter, adjust, etc.) operation of the lateral surge protection device to provide improved surge protection performance over current approaches. For instance, such isolation trenches can be used to adjust beta ($\beta$) of bipolar transistor included in the surge protection devices, which can be used to establish a desired breakdown voltage and/or snapback operation characteristics. Further, such isolation trenches can increase current density capabilities (e.g., current per square) of a surge protection device by altering the geometry of its base (e.g., base current flows under the isolation trench, rather than laterally). Further in the implementations disclosed herein, other aspects of a lateral surge protection device can also be implemented to regulate operation of the device. Such aspects can include substrate (or epitaxial layer) doping concentration, layout and sizing of implants, location of well regions, and so forth.

In some embodiments, one or more aspects of one implementation can be likewise implemented in one or more other implementations. For instance the arrangement and relative sizes of implants (e.g., collector, emitter and/or base implants) shown in one example implementation could also be implemented in other implementations. Further, for purposes of brevity and clarity, each element and aspect of the implementations illustrated in the figures may not necessarily be discussed with respect to each of the figures.

Also, for purposes of clarity, in the implementations illustrated in the drawings and described below (both within a single drawing and from drawing to drawing) each instance of a given element or aspect may not be referenced with a dedicated reference number. Furthermore, throughout the drawings, like and/or similar elements and aspects of the various implementations can be (though not necessarily) referenced with like reference numbers, or similar reference numbers.

Additionally, example lateral surge protection devices are described herein as being implemented with specific conductivity types (e.g., n-type or p-type) for specific implants and/or regions. The doping concentrations of each of these implants and/or regions can vary based on the particular implementation. For purposes of illustration, and by way of example, in certain instances, quantitative examples of doping concentrations are given, while in other instances qualitative examples of doping concentration (e.g., lightly doped, heavily doped, very-heavily doped, and so forth) are given.

Further, in some implementations, the conductivity types of the various regions described can be inverted. That is, regions of the example devices described as being n-type can be implemented as p-type, and vice versa.

FIG. 1A is a block diagram that schematically illustrates a lateral surge protection device 100. In this example, the lateral surge protection device 100 is implemented using a lateral bipolar transistor (e.g., an NPN transistor 110). As shown in FIG. 1A, the NPN transistor 110 is coupled between a node 120 and an electrical ground 130. As described herein, the node 120 can be a node (e.g., signal node, signal pad, etc.) of a semiconductor device that is protected from electrical surge events (e.g., electrostatic discharge (ESD) events, voltage surge events, and/or current surge events) by the protection device (e.g., the NPN transistor 110 in this example). For purposes of this disclosure, nodes to be protected in a semiconductor device (e.g., a transistor gate terminal, etc.) are referenced as node 120, while electrical ground, as coupled to the example protection devices, is referenced as 130. In such implementations, a surge protection device can be configured to absorb (conduct, communicate, etc.) an electrical surge event between the node 120 being protected and electrical ground 130, which, as a result, can protect elements of a corresponding semiconductor device (e.g., gate dielectrics, transistors, etc.) from damage due to such electrical surge events.

In the example implementation of FIG. 1A, the NPN transistor 110 includes a collector 112 (e.g., n-type collector region), an emitter 114 (e.g., n-type emitter region), and a base 116 (e.g., p-type base region). While these regions are schematically shown in FIG. 1A, in the implementations described herein, each of the collector 112, the emitter 114 and the base 116 can, respectively, include multiple portions of a corresponding lateral surge protection device 100. That is, each of the collector 112, the emitter 114 and base 116 can include one or more implants, one or more wells, and/or a portion of a substrate or epitaxial layer used to implement the lateral surge protection device 100 (or other lateral surge protection devices), such as in the example implementations illustrated in, at least, FIGS. 3 and 10-15.

As also shown in FIG. 1A, the NPN transistor 110 includes an isolation trench 118 that is disposed in (situated in, located in, etc.) the base 116 (base region). As noted above, the isolation trench 118 can be configured to regulate (tune, alter, adjust, etc.) operation of the lateral surge protection device 100 to provide desired surge protection performance in a corresponding semiconductor device (e.g., an integrated circuit).

Figure 1B:
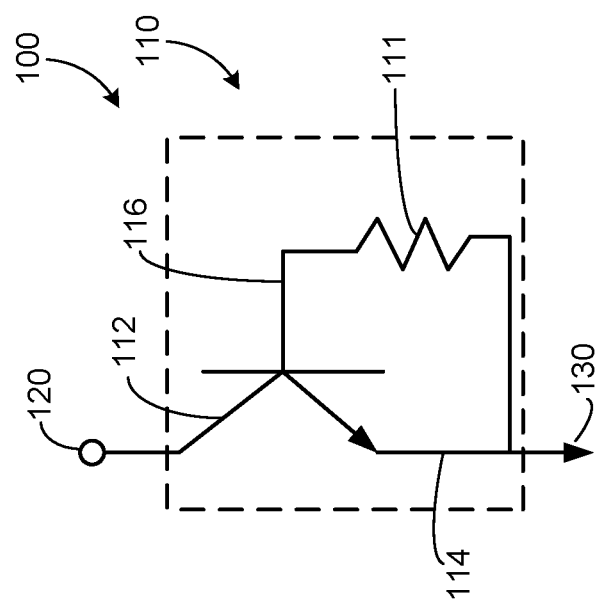

FIG. 1B is a diagram illustrating an electrical schematic of the lateral surge protection device 100 of FIG. 1A. As shown in FIG. 1B, the lateral surge protection device 100 includes the NPN transistor 110, which is coupled between the node 120 and electrical ground 130. As also shown in FIG. 1B, the lateral surge protection device 100 also includes a resistor 111, which is coupled between the base 116 and electrical ground 130. In this example (and other example implementations described herein, such as in FIGS. 3, and 10-15), the resistor 111 can be a combined resistance of the base 116 (e.g., base region) and the emitter 114 (e.g., emitter region) of the NPN transistor 110, such as in the example implementation FIG. 3.

Figure 2A:
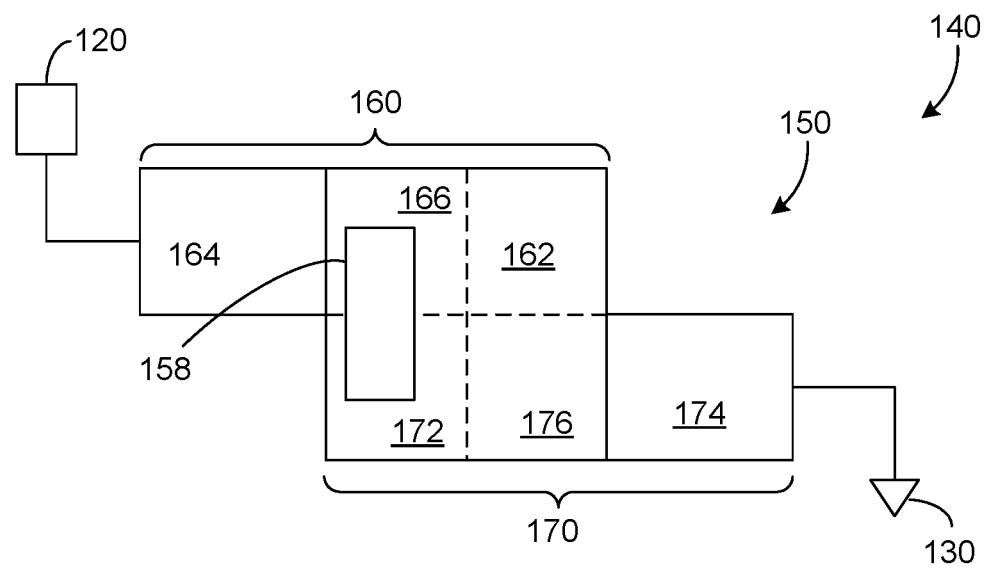

FIG. 2A is a block diagram schematically illustrating another lateral surge protection device 140. In this example, the lateral surge protection device 140 is implemented using a lateral bipolar SCR (e.g., an SCR 150), which can be implemented as a PNPN bipolar device (e.g., can include a PNP transistor 160 and an NPN transistor 170 in a back-to-back arrangement). As shown in FIG. 2A, as with the NPN transistor 110 of FIGS. 1A and 1B, the SCR 150 is coupled between the node 120 (a protected node) and electrical ground 130, so as to protect elements of a corresponding semiconductor device (e.g., gate dielectrics, transistors, etc.) coupled to the node 120 from damage due to electrical surge events.

In the example implementation of FIG. 2A, the PNP transistor 160 of the SCR 150 includes a collector 162 (e.g., p-type collector region), an emitter 164 (e.g., p-type emitter region), and a base 166 (e.g., n-type base region). Further, the NPN transistor 170 includes a collector 172 (e.g., n-type collector region) that is common with the base 166 of the PNP transistor 160 (e.g., is defined by the same elements of the lateral surge protection device 200), an emitter 174 (e.g., n-type emitter region), and a base 176 (e.g., p-type base region) that is common with the collector 162 of the PNP transistor 160 (e.g., is defined by the same elements of the lateral surge protection device 200).

As with the lateral surge protection device 100, while the regions of the PNP transistor 160 and the NPN transistor 170 are schematically shown in FIG. 2A, in the implementations described herein, each of these region can include respective multiple portions of a corresponding lateral surge protection device 200. That is, each of the collectors 162 and 172, the emitters 164 and 174, and bases 166 and 176 can respectively include one or more implants, one or more wells, and/or a portion of a substrate or epitaxial layer used to implement the lateral surge protection device 200, such as in the example implementations illustrated in, at least, FIGS. 4 and 16-24.

As also shown in FIG. 2A, the SCR 150 includes an isolation trench 158 that is disposed in (e.g., situated in, located in, etc.) the base 166 (base region) of the PNP transistor 160 and the collector 172 (collector region) of the NPN transistor 170. As noted above with respect to the isolation trench 118 of the lateral surge protection device 100, the isolation trench 158 of the lateral surge protection device 200 can be configured to regulate (e.g., tune, alter, adjust, etc.) operation of the lateral surge protection device 200 to provide desired surge protection performance in a corresponding semiconductor device (e.g., an integrated circuit).

Figure 2B:
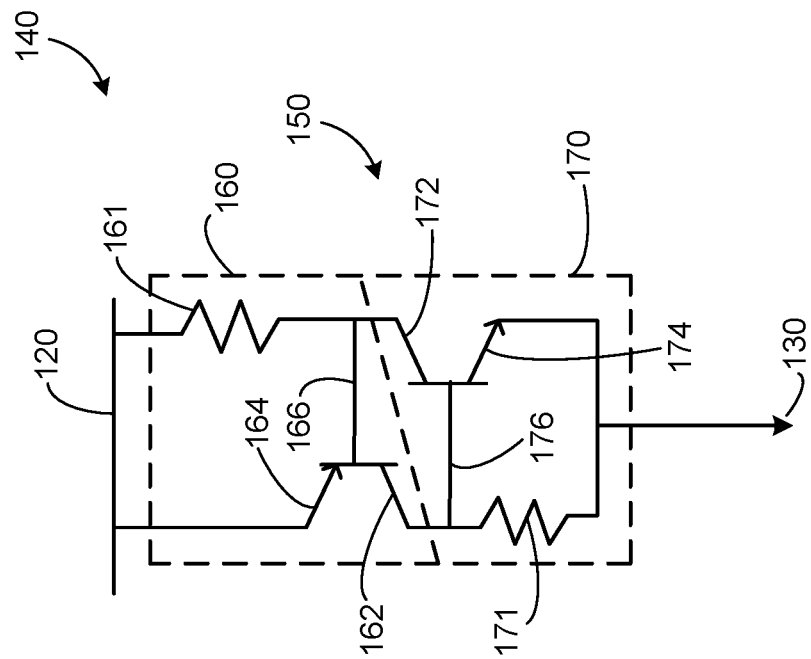
FIGS. 1B and 2B are diagrams illustrating electrical schematics of the lateral surge protection devices of FIGS. 1A and 2A, respectively.

FIG. 2B is a diagram illustrating an electrical schematic of the lateral surge protection device 200 of FIG. 2A. As shown in FIG. 2B, the lateral surge protection device 200 includes the SCR 150, which is coupled between the node 120 and electrical ground 130. As also shown in FIG. 2B, the lateral surge protection device 200 also includes a resistor 161 and a resistor 171, In the lateral surge protection device 200, the resistor 161 is coupled between the base 166 of the PNP transistor 160 and the node 120 (e.g., protected node), while the resistor 171 is coupled between the base 176 of the NPN transistor 170 and electrical ground 130. In this example (and other example implementations described herein, such as in FIGS. 4, and 16-24), the resistor 161 can be a combined resistance of the base 166 (e.g., base region) and the emitter 164 (e.g., emitter region) of the PNP transistor 160, while the resistance 171 can be a combined resistance of the base 176 (e.g., base region) and the emitter 174 (e.g., emitter region) of the NPN transistor 170. It is noted that the resistor 161 can also be considered to include a resistance of the collector 172 of the NPN transistor 172, as the collector 172 is common with the base 166 of the PNP transistor 160. Likewise, the resistor 171 can also be considered to include a resistance of the collector 162 of the PNP transistor 160, as the collector 162 is common with the base 176 of the NPN transistor 170.

Figure 3:
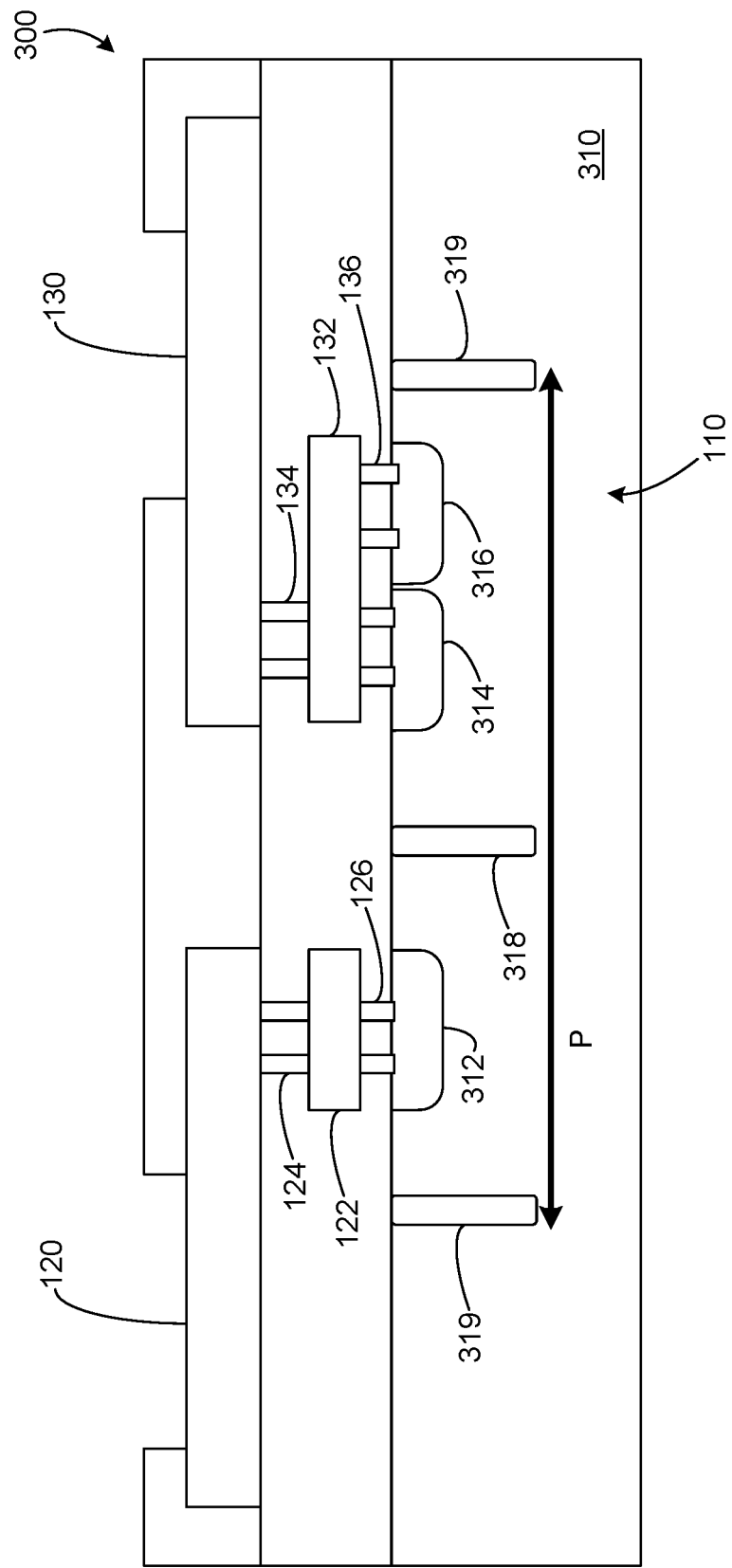
FIG. 3 is a diagram illustrating a cross-sectional view of an implementation of the lateral surge protection device of FIGS. 1A and 1B.
Figure 24:
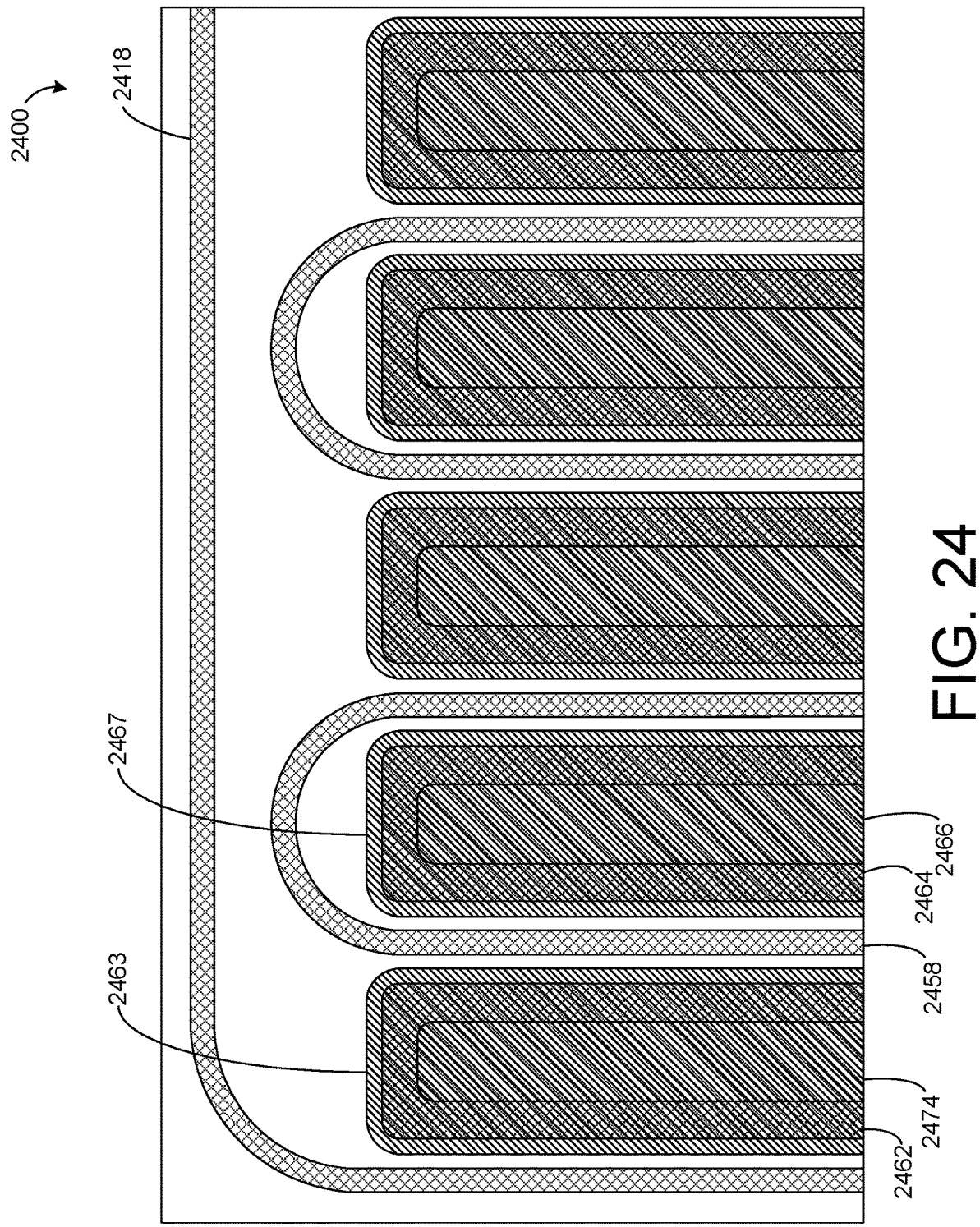
FIG. 24 is a diagram illustrating a design layout of a portion of a lateral SCR device, such as the device of FIG. 21.

FIG. 3 is a diagram illustrating a cross-sectional view of a lateral surge protection device 300 that can implement the lateral surge protection device 100 of FIGS. 1A and 1B (e.g., includes an NPN transistor 110). In some implementations, the lateral surge protection device 300 shown in FIG. 3 can be a segment (e.g., cell, etc.) of an NPN transistor. That is, in some implementations, multiple instances of the NPN transistor 110 shown in FIG. 3 can be interconnected to form a single NPN transistor, or to form multiple NPN transistors. As shown in FIG. 3, the NPN transistor 110 can have a pitch P, which can be on the order of 10-15 μm. It is noted that the NPN transistor 110 of FIG. 3 can extend into, and out of the page, and the features (such as trench 318 and/or trench 319) can form respective stripes and/or perimeters. For instance, in some implementations, the trenches 318 and 319 can form perimeters, at least in part, around each cell of the NPN transistor 110, or around an NPN transistor that includes multiple instances of the cell shown in FIG. 3. An example of such trench implementations is illustrated in FIG. 24.

As with the lateral surge protection device 100 of FIGS. 1A-1B, and the lateral surge protection device 140 of FIGS. 2A-2B, the NPN transistor 110 in FIG. 3 is coupled between the node 120 (a protected node) and electrical ground 130. In the lateral surge protection device 300, the node 120 is implemented using first signal metal (indicated as 120), vias 124, second signal metal 122 and contacts 126. Similarly, in FIG. 3, electrical ground 130 is implemented using third signal metal (indicated as 130), vias 134, fourth signal metal 132 and contacts 136. In some implementations, the first signal metal of the node 120 and the third signal metal of electrical ground 130 can be portions of a first patterned signal metal layer, while the second signal metal 122 of the node 120 and the third signal metal 132 of electrical ground 130 can be portions of a second patterned signal metal layer. In some implementations, each of the signal metal layers of the lateral surge protection device 300 can be 2-3 micrometers (μm) thick, or greater. Using two, or more, such signal metal layers for each of the node 120 and electrical ground 130 can allow for increased current carrying capability, as compared to surge protection devices using fewer or thinner signal metal layers. Such increased current carrying capability can prevent damage (e.g., thermal damage) to the lateral surge protection device 300 during an electrical surge event.

As shown in FIG. 3, the NPN transistor 110 can be implemented in a semiconductor layer 310. In some implementations, the semiconductor layer 310 can be a lightly doped p-type substrate, or can be a lightly doped p-type epitaxial layer (e.g., disposed on either a p-type substrate or an n-type substrate). The lateral surge protection device 300 of FIG. 3 also includes a collector implant 312 (e.g., a very-heavily doped n-type implant), an emitter implant 314 (e.g., a very-heavily doped n-type implant), and a base implant 316 (e.g., a very-heavily doped p-type implant). In the lateral surge protection device 300, the collector implant 312 is electrically coupled with the node 120, while the collector implant 314 and the base implant 316 are electrically coupled with electrical ground 130.

In the lateral surge protection device 300, a base region of the NPN transistor 110 can include the base implant 316 and a portion of the semiconductor layer 310 (e.g., a portion of the semiconductor layer 310 between the collector implant 312 and the emitter implant 314). As shown in FIG. 3, an isolation trench 318 can be disposed in the portion of the semiconductor layer 310 that is included in the base region of the NPN transistor 110. The isolation trench 318 can, depending on the particular implementation, have a dielectric and/or undoped poly disposed therein.

In the lateral surge protection device 300, the trench 318 is disposed between the collector implant 312 and both the emitter implant 314 and the base implant 316. As discussed above with respect to the isolation trench 118, the trench 318 can be configured to adjust (e.g., tune, modify, control, etc.) operation of the lateral surge protection device 300, e.g., to achieve desired performance behavior of the lateral surge protection device 300. That is, the trench 318 can be configured to modify the base region of the NPN transistor 110, e.g., adjust β of the NPN transistor 110, direct base current (e.g., between the emitter implant 314 and the collector implant 312) under the trench 318, etc., such that desired operation of the lateral surge protection device 300 is achieved. As noted above, other aspects of the lateral surge protection device 300, such as doping concentration of the semiconductor layer 310, arrangement and size of the implants, etc., can also be configured (established, utilized, etc.) to adjust operation of the lateral surge protection device 300 to achieve desired surge protection performance.

Figure 4:
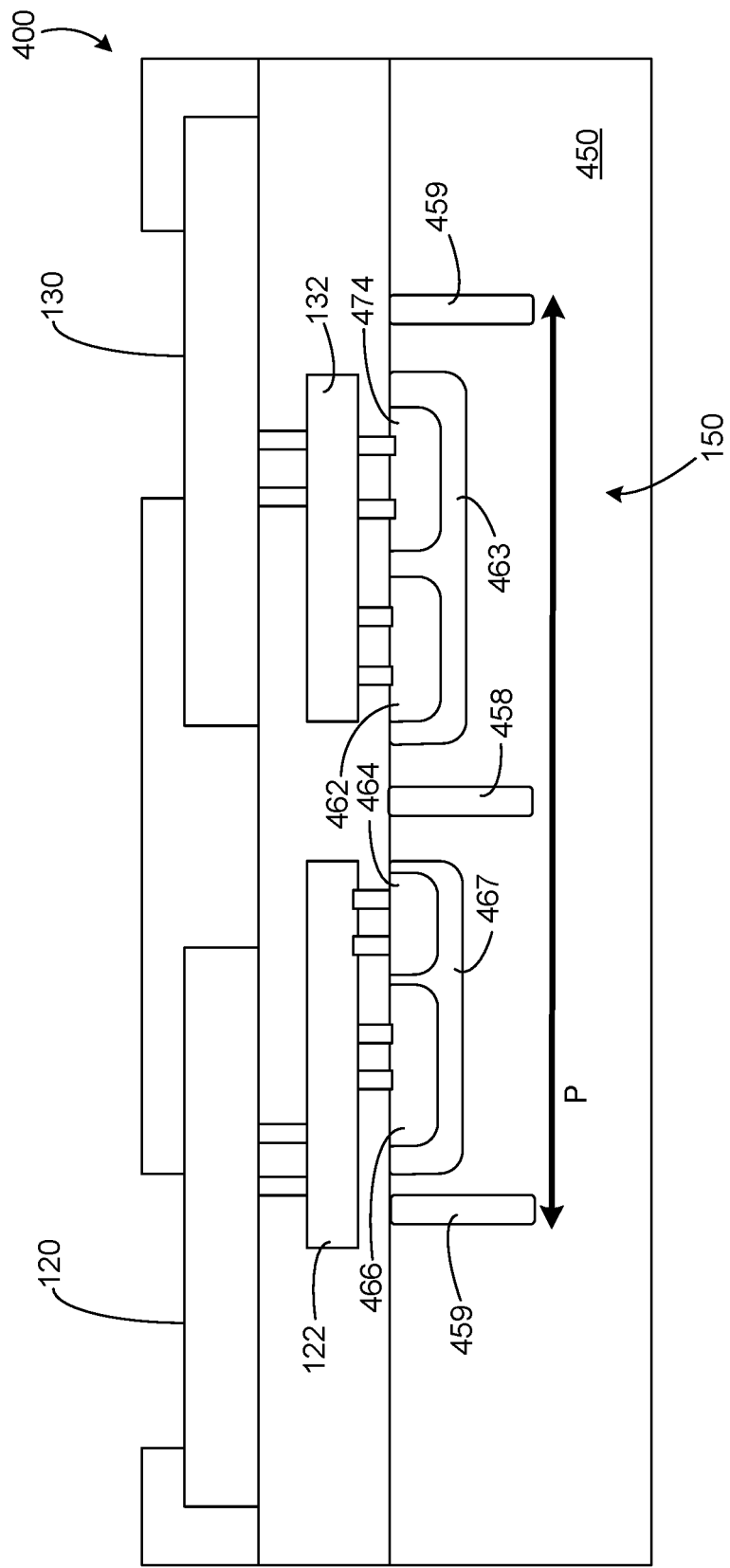
FIG. 4 is a diagram illustrating a cross-sectional view of an implementation of the lateral surge protection device of FIGS. 2A and 2B.

FIG. 4 is a diagram illustrating a cross-sectional view of a lateral surge protection device 400 that can implement the lateral surge protection device 140 of FIGS. 2A and 2B (e.g., includes a SCR 150). In some implementations, the lateral surge protection device 400 shown in FIG. 4 can be a segment (e.g., cell, etc.) of the SCR 150. That is, in some implementations, multiple instances of the SCR 150 shown in FIG. 4 can be interconnected to form a single SCR, or to form multiple SCRs. As shown in FIG. 4, as with the lateral surge protection device 300 of FIG. 3, the SCR 150 can have a pitch P, which can be on the order of 10-15 μm. It is noted that, as with the lateral surge protection device 300, the features of the SCR 150 shown in FIG. 4 can extend into, and out of the page, and the features (such as trench 458 and/or trench 459) can form respective stripes and/or perimeters. For instance, in some implementations, the trenches 418 and 419 can form perimeters, at least in part, around each cell of the lateral surge protection device 140, or around a SCR that includes multiple instances of the cell shown in FIG. 4. As noted above with respect to FIG. 3, an example of such trench implementations is illustrated in FIG. 24.

As with the lateral surge protection device 100 of FIGS. 1A-1B, and the lateral surge protection device 140 of FIGS. 2A-2B, the SCR 150 in FIG. 4 is coupled between the node 120 (a protected node) and electrical ground 130. In the lateral surge protection device 400, the node 120 and electrical ground are implemented using multiple layers of signal metal, vias, and contacts, such as described with respect to the lateral surge protection device 300. For purposes of brevity, those details are not described again in detail with respect to the lateral surge protection device 400.

As shown in FIG. 4, the lateral surge protection device 400 can be implemented in a semiconductor layer 450. In some implementations, the semiconductor layer 450 can be a lightly doped n-type substrate, or can be a lightly doped n-type epitaxial layer (e.g., disposed on either a p-type substrate or an n-type substrate). The lateral surge protection device 400 of FIG. 400 also includes a number of implants that define a PNP transistor and an NPN transistor of the SCR 150. Due to the back-to-back arrangement of the PNP transistor and the NPN transistor (the collector of the PNP transistor and the base of the NPN transistor being common, and the collector of the NPN transistor and the base of the PNP transistor being common), they are not specifically indicated in FIG. 4. However, their elements (collectors, emitters, and bases) are described below.

The SCR 150 of FIG. 4 includes an implant 462, an implant 464, an implant 466 and an implant 474. In this example, the implant 462 and the implant 464 can be very-heavily doped p-type implants, while the implant 466 and the implant 474 can be very heavily doped n-type implants. The lateral surge protection device 400 also includes a heavily doped p-type well 463 and a heavily doped n-type well 467 that are disposed in the semiconductor layer 450. In the lateral surge protection device 400 of FIG. 4, the implants 462 and 464 are disposed in the p-type well 463, while the implants 464 and 466 are disposed in the n-type well 467.

In this example, a collector of the PNP transistor of the SCR 150 can be defined by the implant 464, while an emitter of the NPN transistor of the SCR 150 can be defined by the implant 474. Further, the implant 466, the n-type well 467 and a portion of the semiconductor layer 450 (e.g., between the n-type well 467 and the p-type well 463) can be included in a base of the PNP transistor and a collector of the NPN transistor. Still further, the implant 462 and the p-type well 463 can be included in a base of the NPN transistor and an emitter of the PNP transistor. That is the base of the PNP transistor and the collector of the NPN transistor can be common, and the base of the NPN transistor and the collector of the PNP transistor can be common. In the lateral surge protection device 400, the implants 464 and 466 are electrically coupled with the node 120, while the implants 462 and 474 are electrically coupled with electrical ground 130.

As shown in FIG. 4, an isolation trench 458 can be disposed in the portion of the semiconductor layer 450 that is included in the base region of the PNP transistor and the collector region of the NPN transistor. As with the isolation trench 318, the isolation trench 458 can, depending on the particular implementation, have a dielectric and/or undoped poly disposed therein. As discussed above with respect to the isolation trench 158, the isolation trench 458 can be configured to adjust (tune, modify, control, etc.) operation of the lateral surge protection device 400, e.g., to achieve desired performance behavior of the lateral surge protection device 400. That is, the trench 458 can be configured to modify the base region of the PNP transistor of the SCR 150, e.g., adjust β of the PNP transistor, direct base current of the PNP transistor (e.g., between the n-type well 467 and the p-type well) under the trench 458, etc., such that desired operation (e.g., snapback operation) of the lateral surge protection device 400 is achieved. As noted above, other aspects of the lateral surge protection device 400, such as doping concentration of the semiconductor layer 450, arrangement and size of the implants, etc., can also be configured (established, utilized, etc.) to adjust operation of the lateral surge protection device 400 to achieve desired surge protection performance.

Figure 5:
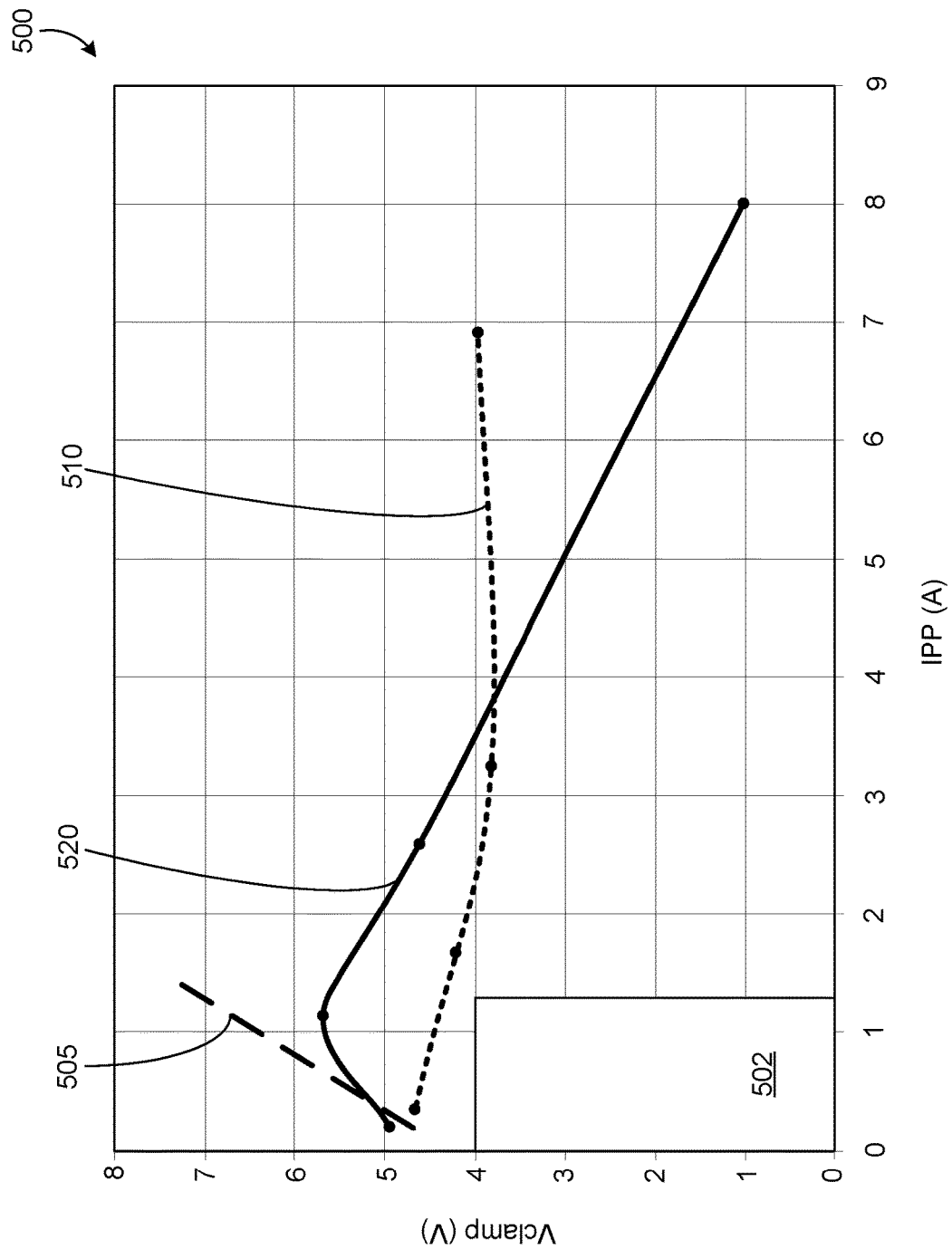
FIG. 5 is a graph illustrating simulation results comparing surge protection performance of the devices of FIGS. 3 and 4 with current implementations.

FIG. 5 is a graph 500 illustrating simulation results comparing surge protection performance of the devices of FIGS. 3 and 4 with a current implementation (e.g., a surge protection device that does not include an isolation trench). In the graph 500, values of a surge current (IPP(A) shown in the X-axis) and associated clamping voltages (Vclamp(V) shown on the Y-axis) are normalized, as the specific values will depend on the particular implementation. An area 502 shown in FIG. 5 illustrates an example of a safe-operating-area, e.g., that specifies current and voltage values for electrical surges that should be tolerated, where values outside the area 502 would be considered to exceed those specifications. In an example implementation, the area 502 can correspond with a surge current of 6.5 amps (A) and a clamping voltage of 20 volts (V).

In the graph 500, the current-voltage (IV) characteristics of a current (conventional) protection structure is illustrated by trace 505, IV characteristics of an implementation of the lateral surge protection device 300 of FIG. 3 is illustrated by trace 510, and IV characteristics of an implementation of the lateral surge protection device 400 of FIG. 4 is illustrated by trace 520. As shown in FIG. 5, while the IV characteristics shown by the trace 505 are outside the area 502, as current IPP increases, clamping voltage also increases, which can result in damage to a semiconductor device due to, e.g., due to overheating from associated power consumption.

In comparison with the IV characteristics shown by the trace 505, the IV characteristics of the trace 510 (e.g., for an implementation of the lateral surge protection device 300) are comparatively flat, with the clamping voltage initially decreasing at normalized current values between 0 and 3. Further, the IV characteristics of the trace 520 (e.g., for an implementation of the lateral surge protection device 400), after an initial increase in clamping voltage with increasing current IPP, shows a continual decline in clamping voltage, e.g., due snapback operation of the lateral surge protection device 400. Accordingly, the operation for the implementations of the lateral surge protection device 300 and the lateral surge protection device 400 are advantageous over current approaches, as they do not display a continual increase in clamp voltage.

Figure 6A:
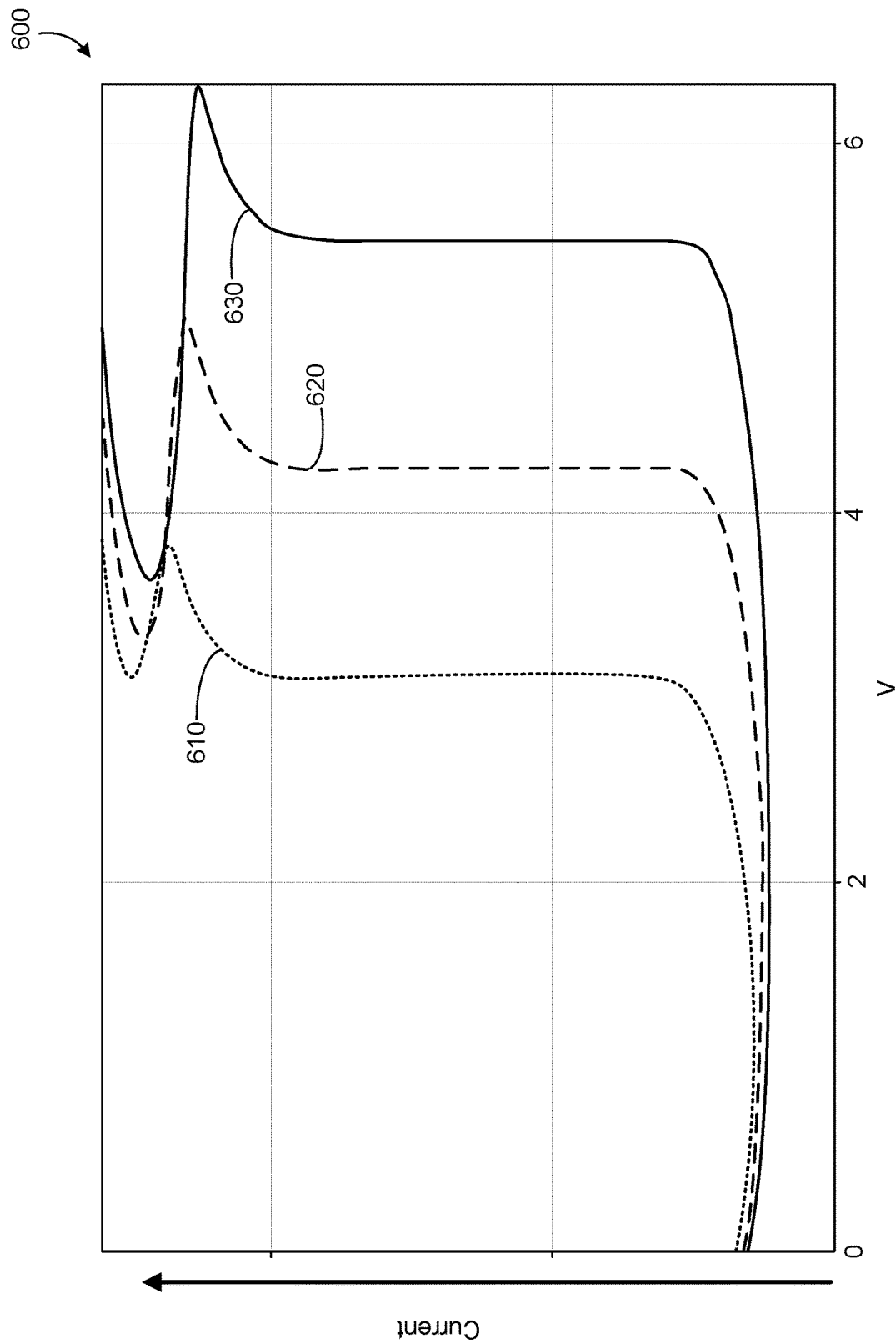
FIGS. 6A and 6B are graphs illustrating effects of doping concentration and of isolation trench depth, respectively, on operation of an implementation of the device of FIG. 3.

FIG. 6A is a graph 600 illustrating effects of doping concentration on operation of an implementation of the device 300 of FIG. 3. Specifically, FIG. 6A illustrates breakdown voltage behavior (on the X-axis) and associated current behavior (on the Y-axis) for different doping concentrations of the semiconductor layer 310 of an implementation of the lateral surge protection device 300. As with the graph 500, the voltage and current values in the graph 600 are normalized or not indicated, and the specific values will depend on the particular implementation. For purposes of illustration, example values for an implementation are given below. Also, in the discussion of the graph 600, further reference is made to FIG. 3.

In the graph 600, traces 610, 620 and 630 respectively illustrate voltage breakdown and snapback behavior for respective implementations of the lateral surge protection device 300 with three different doping concentrations of the semiconductor layer 310. Specifically, the trace 610 illustrates a highest doping concentration (e.g., $1 \times 10^{17}$), the trace 620 illustrates an intermediate doping concentration (e.g., $5 \times 10^{16}$), and the trace 630 illustrates a lowest doping concentration (e.g., $1 \times 10^{16}$). As can be seen from the graph 600, while higher doping concentrations (e.g., traces 610 and 620) exhibit lower breakdown voltages (e.g., 15 V and 21 V, respectively), they also exhibit less extreme snapback characteristics. As shown by the trace 630 (the lowest semiconductor layer 310 doping concentration), while having a higher breakdown voltage (e.g., 27 V) than the implementations with higher doping concentration, the implementation of the trace 630 also exhibits the most extreme snapback behavior.

Figure 6B:
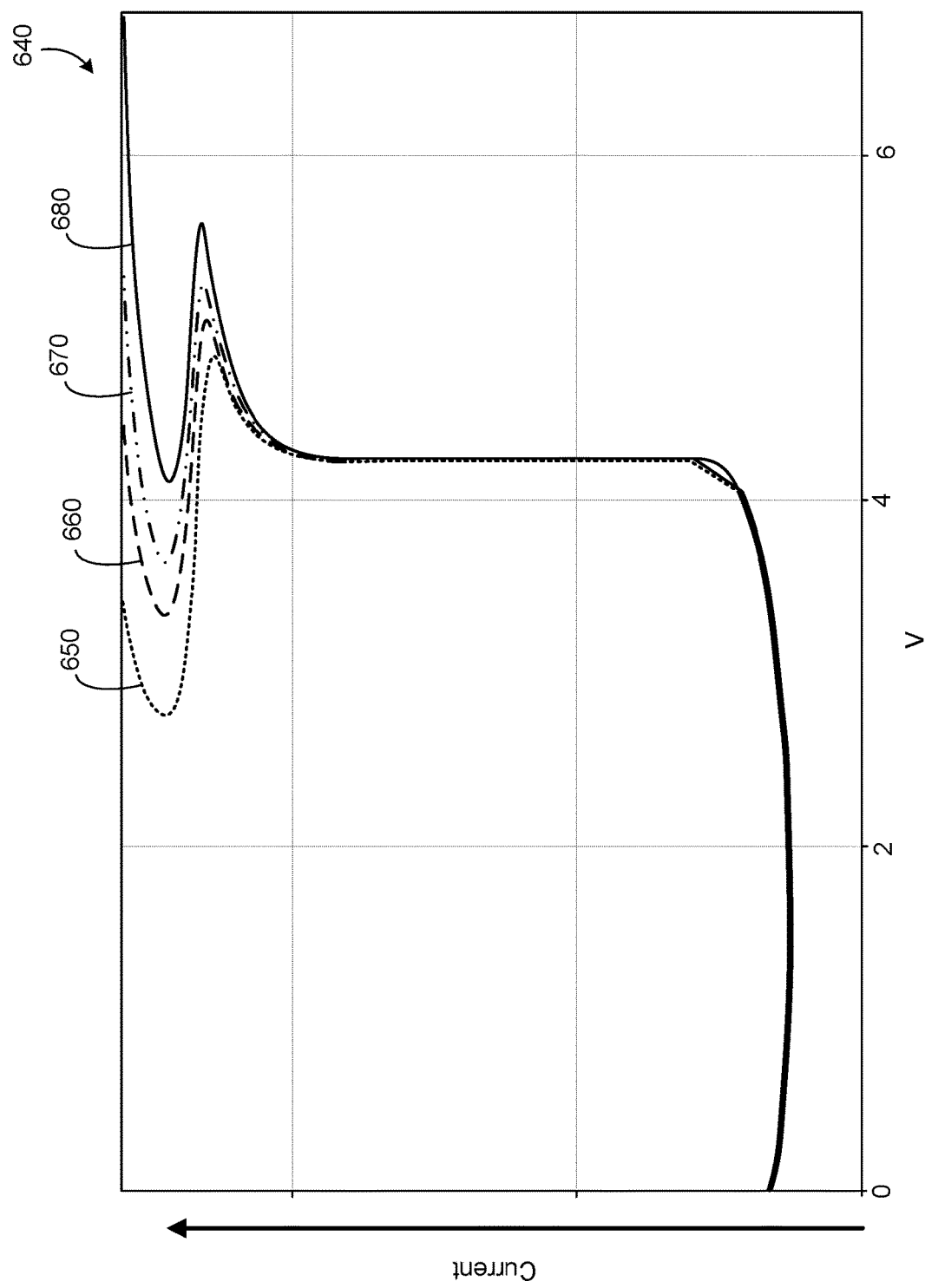

FIG. 6B is a 600 graph 640 illustrating effects of isolation trench depth on operation of an implementation of the lateral surge protection device 300 of FIG. 3. Specifically, FIG. 6B illustrates breakdown voltage behavior (on the X-axis) and associated current behavior (on the Y-axis) for different depths of the isolation trench 318 at a constant doping concentration of the semiconductor layer 310. As with the graphs 500 and 600, the voltage and current values in the graph 640 are normalized or not indicated, and the specific values will depend on the particular implementation. In the graph 640, a doping concentration of the semiconductor layer 310 corresponds with the intermediate doping concentration associated with the trace 620 in FIG. 6A (e.g., $5 \times 10^{16}$).

In the graph 640, trace 650 corresponds with operation of the lateral surge protection device 300 with the isolation trench 318 having a depth of approximately 1 μm, trace 660 corresponds with operation of the lateral surge protection device 300 with the isolation trench 318 having a depth of approximately 3 μm, the trace 670 corresponds with operation of the lateral surge protection device 300 with the isolation trench 318 having a depth of approximately 5 μm, and the trace 680 corresponds with operation of the lateral surge protection device 300 with the isolation trench 318 having a depth of approximately 9 μm. In the implementations of the lateral surge protection device 300 illustrated in FIGS. 6A and 6B (as well as other implementations), the implants (collector, base and emitter) can have a depth in the semiconductor layer 310 of approximately 0.5 μm.

As shown in FIG. 6B, depth of the isolation trench 318 may not have a significant impact on the breakdown voltage (approximately 21 V in this example), though isolation trench depth does affect snapback behavior, with deeper depths of the isolation trench 318 demonstrating less extreme snapback behavior. Accordingly, in view of the correlation of breakdown voltage with doping concentration (as shown in FIG. 6A) and the correlation of isolation trench depth with snapback behavior (as shown in FIG. 6B), breakdown voltage and snapback behavior for implementations of lateral surge protection devices, such as those described herein, can be established, at least to a first order, by respective selection of doping concentration (e.g., of a semiconductor substrate or epitaxial layer in which the lateral surge protection device is implemented) and isolation trench depth (e.g., in a base region of the lateral surge protection device).

FIGS. 7A and 7B are graphs 700 and 730 illustrating operation of implementations of the lateral surge protection device 400 of FIG. 4. Specifically, FIG. 7A illustrates breakdown voltage behavior (on the X-axis) and associated current behavior (on the Y-axis) for an implementation of the lateral surge protection device 400 (e.g., the SCR 150). FIG. 7B is a graph 750 that illustrates operation of an implementation of the lateral surge protection device 400 with a much larger SCR 150 (e.g., approximately 14,000 times larger than the SCR 150 illustrated by FIG. 7A). As with the graphs 500, 600 and 640, the voltage and current values in the graphs 700 and 730 are normalized or not indicated, and the specific values will depend on the particular implementation. In the graph 700, a doping concentration of the semiconductor layer 450 corresponds with the intermediate doping concentration of the examples of FIGS. 6A and 6B (e.g., $5 \times 10^{16}$).

In the graph 700, the trace 710 illustrates operation of the example implementation of the lateral surge protection device 400 discussed above. As a comparison with the lateral surge protection device 300, a breakdown voltage of the lateral surge protection device 400 can be greater that the breakdown voltage of the lateral surge protection device 300 for a same semiconductor layer (e.g. substrate) doping concentration (e.g., 24 V versus 21 V in the described examples). However, snapback behavior of the lateral surge protection device 400, indicated as 720 in FIG. 7A, varies from the snapback behavior of the lateral surge protection device 300. This difference in snapback behavior is due, at least in part, to the structure of the SCR 150 of lateral surge protection device 400, which has a two-step snapback operation. For instance, in this example, a first snapback 730 results from snapback of the NPN transistor when its base current is high enough to turn on its base-to-emitter junction. As shown in FIG. 7A, a second snapback 720 results from turn-on of the PNP transistor of the SCR 150 of the lateral surge protection device 400. This turn-on is triggered by a collector current of NPN transistor (e.g., after it has snapped back).

In FIG. 7B, the trace 760 shown the IV characteristics of the lateral surge protection device 400 with the larger SCR 150 (e.g., 14,000 times the size of the device of FIG. 7A. In figure, the current scale illustrates currents higher than those in FIG. 7A (e.g., at least one order of magnitude larger). As shown in FIB. 7B, only a single snapback 770 occurs, even at the higher current. That is, FIG. 7B, when compared to FIG. 7A, illustrate that with the larger device size scaling (14000× larger), snapback (first snapback) occurs at a much higher current and, in the example implementation, no second snapback occurs, even at the higher currents of FIG. 7B.

Figure 8:
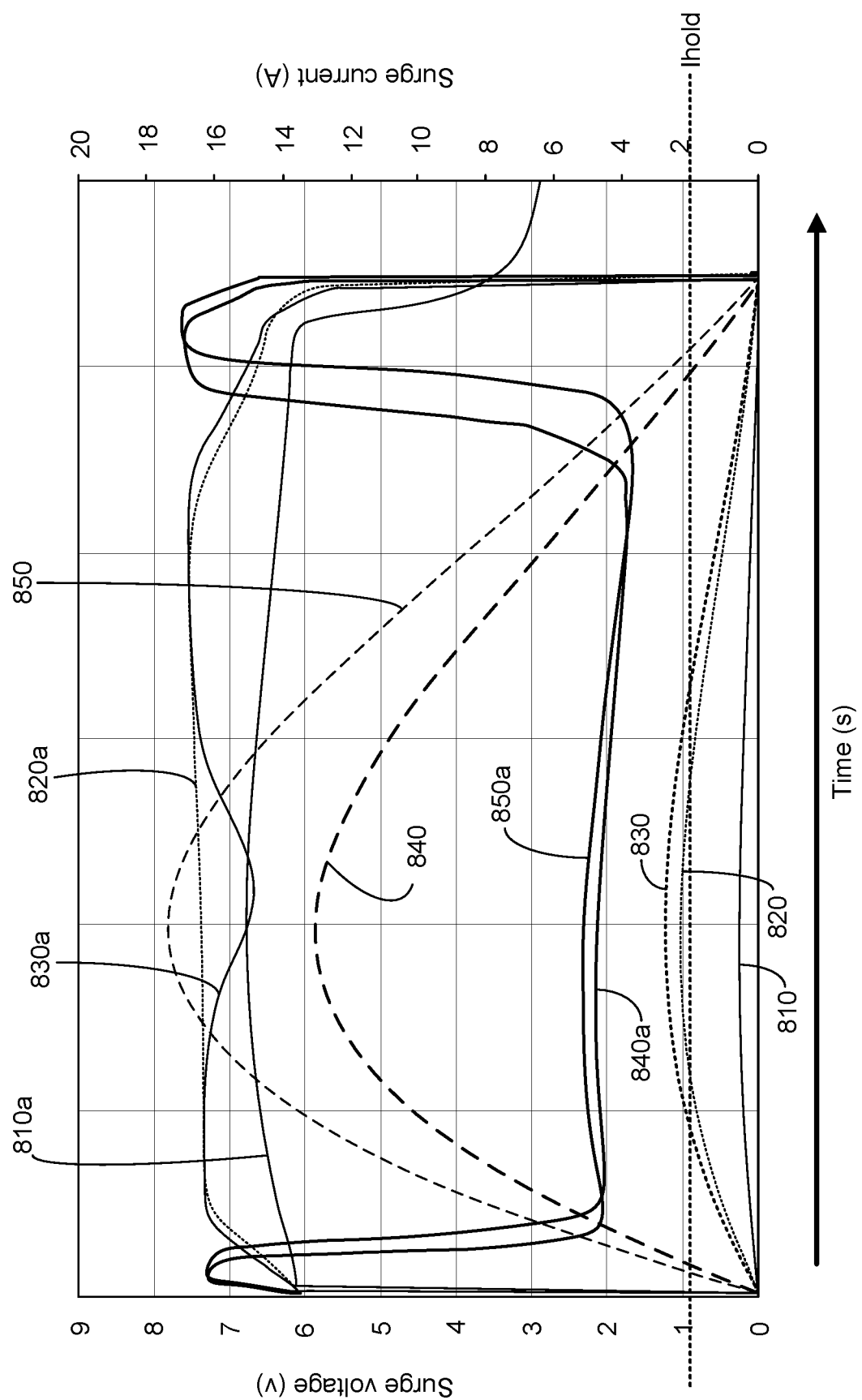

FIG. 8 is a graph 800 illustrating operation of an implementation of the lateral surge protection device 400 of FIG. 4. Specifically, FIG. 8 illustrates at time domain representation of surge protection performance for an implementation of the lateral surge protection device 400 at different currents and associated voltages. In FIG. 8, surge voltages (with solid lines referenced to the left-side Y-axis) versus surge currents (with dashed lines referenced to the right-side Y-axis) are shown over time (on the X-axis). As with the graphs in FIGS. 5-7B, the voltage, current and time values in the graph 800 are normalized or not indicated, and the specific values will depend on the particular implementation. For purposes of illustration, example values for an implementation of the lateral surge protection device 400 are given below. Accordingly, in the discussion of the graph 800, further reference is made to FIG. 4. In the graph 800, a target holding (clamping) current Ihold is indicated, where Ihold can be 20 A in this example implementation.

In FIG. 8, traces 810, 820, 830, 840 and 850 illustrate example surges currents, while traces 810*a*, 820*a*, 830*a*, 840*a* and 850 illustrate corresponding and respective surge voltages. As shown in FIG. 8, peaks of the surge currents represented by the traces 810, 820 and 830 are, respectively, below at, and just greater than Ihold (which may indicate that an electrical surge event outside a safe operating range has not occurred). As shown by the corresponding voltage traces 810*a*, 820*a* and 830*a*, the associated surge voltages are substantially the same (e.g., no snapback occurs in the SCR of the lateral surge protection device 400).

In comparison to the surge currents 810, 820 and 830, the respective peaks of the surge currents represented by the traces 840*a* and 840*b* are significantly greater than Ihold (approximately six and nine times greater, respectively). As shown by the corresponding voltage traces 840*a* and 850*a*, when the respective surge currents exceed a value approximately two times Ihold, the surge voltages of traces 840*a* and 850*a* drop (e.g., to approximately 30% of the surge voltages shown by the traces 810*a*, 820*a* and 830*a*). This drop in surge voltage (holding voltage) can be achieved as a result of snapback behavior of the SCR 150 of the lateral surge protection device 400. This behavior can also prevent excess heating of the lateral surge protection device 400, due to the lower power dissipation associated with the reduce holding voltage. This can prevent drastic changes in β (due to temperature changes) of the base of PNP transistor of the SCR 150, which can provide more predicable behavior of the lateral surge protection device 400 and prevent damage (e.g., thermal damage) to the lateral surge protection device 400 and associated semiconductor devices (e.g., devices connected to the node 120 that are protected by the lateral surge protection device 400).

Figure 9:
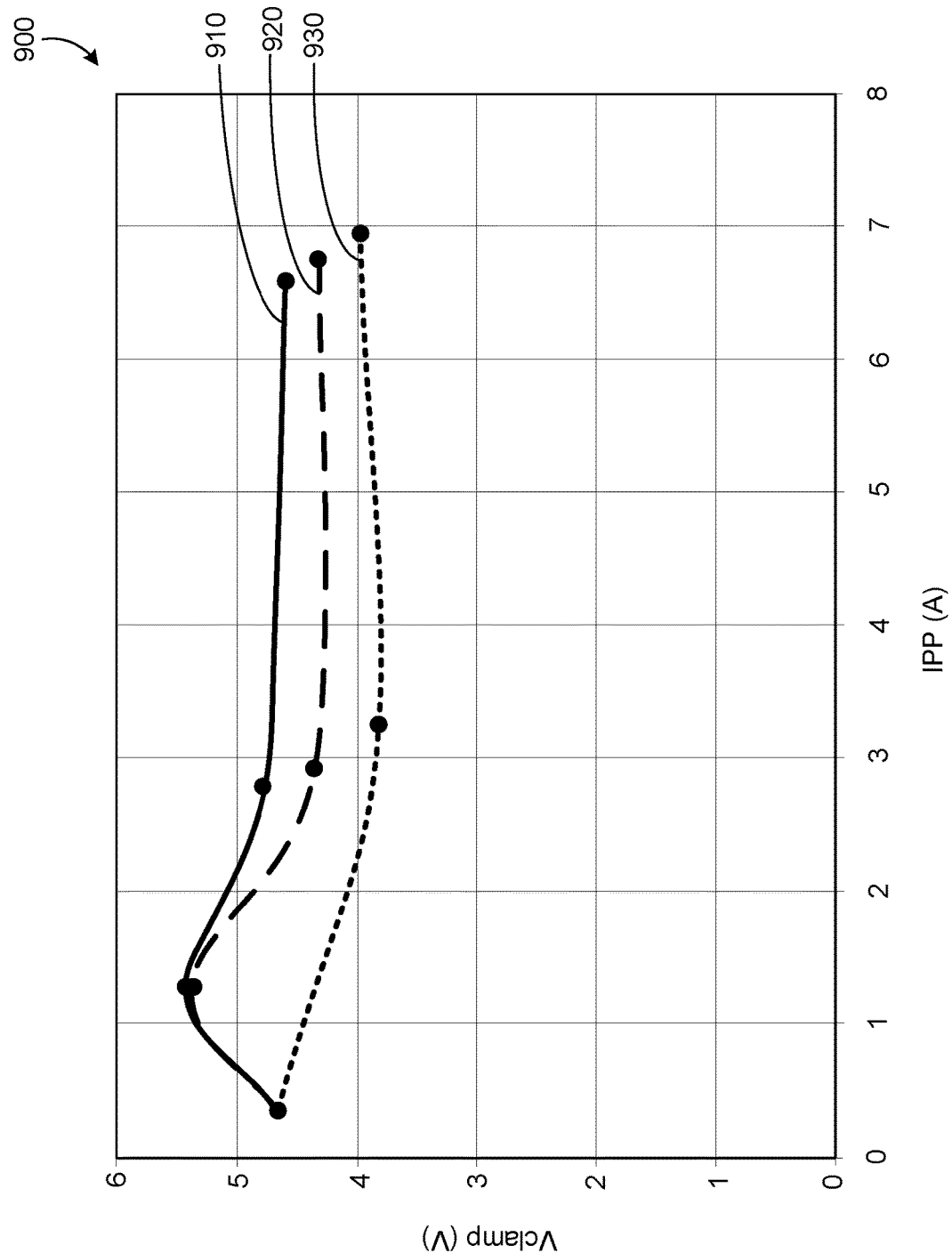
FIG. 9 is graph illustrating effects of layout, doping concentration and trench depth on operation of an implementation of the device of FIG. 3.
Figure 10:
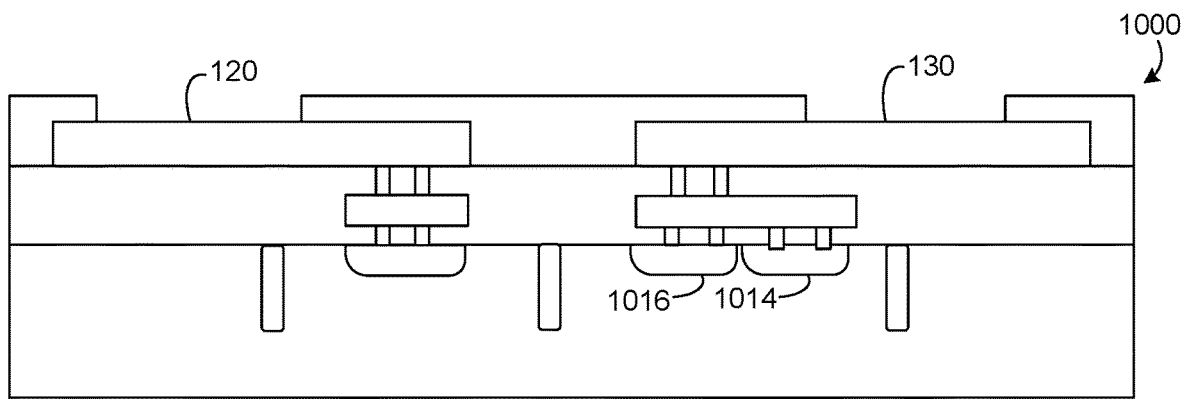
FIGS. 10-15 illustrate various implementations of lateral surge protection devices implemented as lateral NPN transistors, such as variations of the device of FIG. 3.

FIG. 9 is graph illustrating effects of layout, doping concentration and trench depth on operation of an implementation of the device of FIG. 3. The traces 910, 920 and 930 are simulation results of surge protection operation (taking thermal variation into account) of variations of the lateral surge protection device 300 shown in FIG. 3, such as with variations in layout, as shown in FIG. 10. As shown by the traces 910, 920 and 920, such layout variations can be used to adjust (tune, modify, etc.) a clamping voltage of the illustrated lateral surge protection devices. For instance, layout changes can be used to obtain more or less snapback operation, such as illustrated by the traces 910 to 930. Such changes can also be achieved by varying trench depth and/or doping concentration, as discussed herein.

FIGS. 10-15 illustrate various implementations of lateral surge protection devices implemented as (including, etc.) lateral NPN transistors, such as variations and/or combinations of the NPN transistor 110 of FIG. 3. As the implementations of FIG. 10-15 are variations (including combinations) of the NPN transistor 110 of FIG. 3, for purposes of brevity, the details of the NPN transistor 110 of FIG. 3 are not repeated again with respect to FIGS. 10-15. That is, the discussion of FIGS. 10-15 is directed to differences between the NPN transistor 110 illustrated in FIG. 3 and the implementations of FIGS. 10-15, and/or to combinations of the NPN transistor 110 shown in those drawings. In each of the implementations illustrated in FIGS. 10-15, the node 120 (the protected node) and electrical ground 130 are indicated for reference purposes only, and those connections may not be discussed further. Where multiple nodes are protected by given structures, those nodes are enumerated as node 120a, node 120b, etc.

Referring to FIG. 10, a lateral surge protection device 1000 is shown that includes an emitter implant 1014 and a base implant 1016. Compared with the NPN transistor 110, the emitter implant 1014 and the base implant 1016 of the lateral surge protection device 1000 are located in opposite positions than the emitter implant 314 and the base implant 316 of FIG. 3. Such an arrangement changes the configuration of the base and collector of the NPN transistor, which can adjust a clamping voltage (adjust snapback), such as shown in FIG. 9

Figure 11:
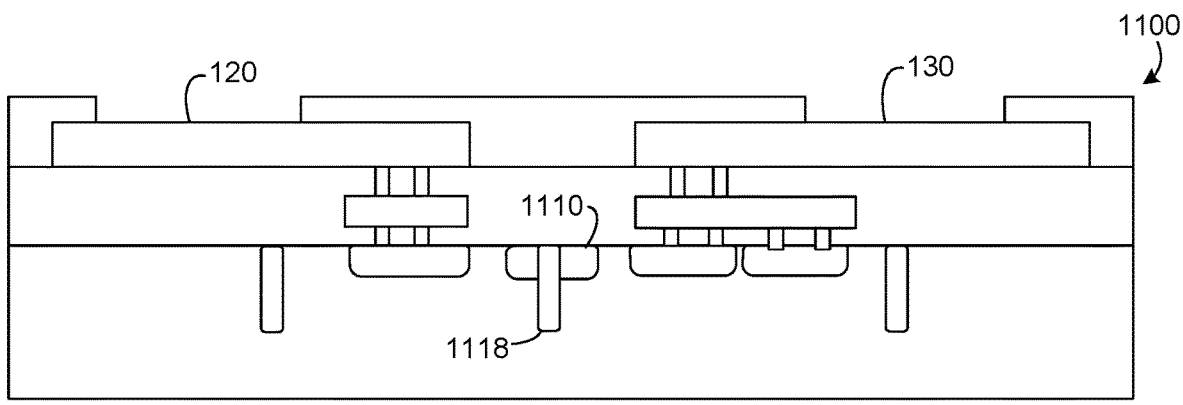
Figure 12:
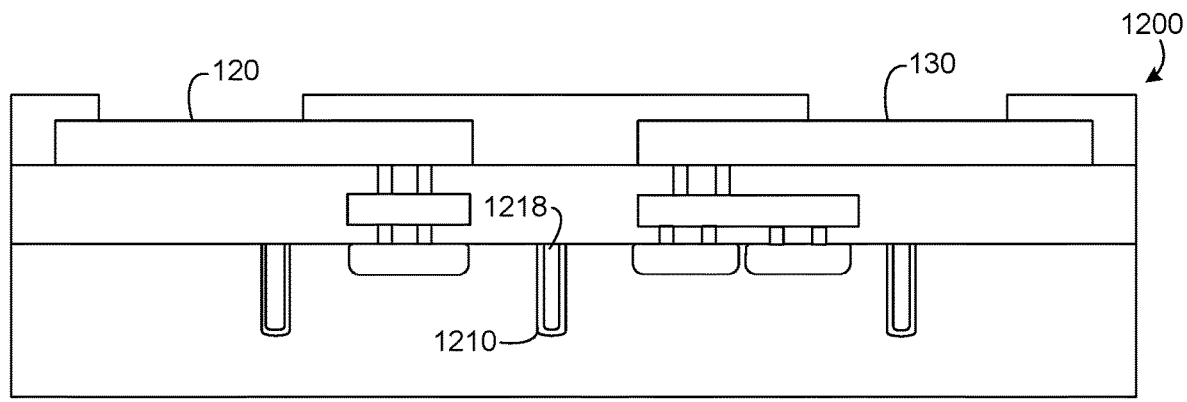

Referring to FIGS. 11 and 12 as compared to FIG. 3, a lateral surge protection device 1100 in FIG. 11 includes a very-heavily doped p-type implant 1110 near the surface of its isolation trench 1118 (e.g., at least partially surrounding the isolation trench 1118), while a lateral surge protection device 1200 in FIG. 12 includes a heavily doped p-type implant 1210 formed along a sidewall of its isolation trench 1218. The p-type implants 1110 and 1210 of FIGS. 11 and 12 can, in some implementations, reduce leakage of those lateral surge protection devices, as compared to the device 300.

Figure 13:
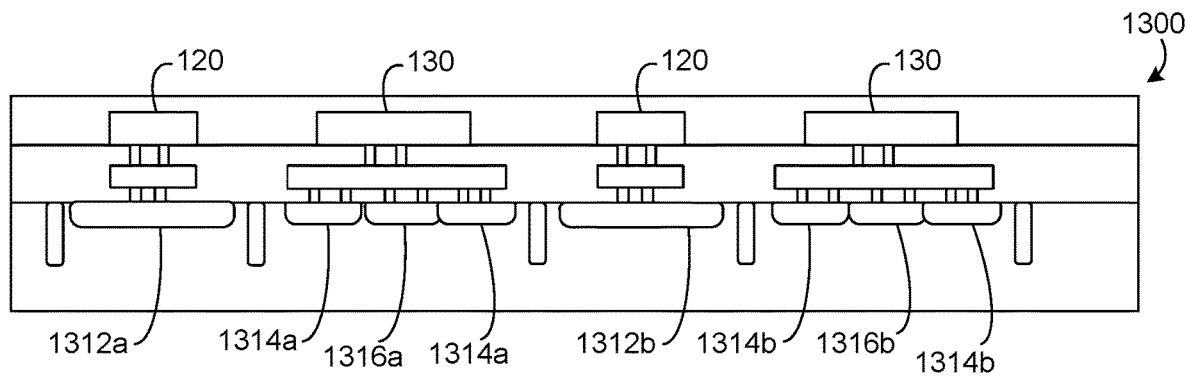

Referring to FIG. 13, a lateral surge protection device 1300 is shown that includes multiple NPN transistor segments that implement a single protection device coupled between the node 120 and electrical ground 130. As shown in FIG. 13, the lateral surge protection device 1300 includes two collector implants 1312a and 1312b, two emitter implants 1314a and 1314b, and two base implants 1316a and 1316b. In some implementations, the pattern illustrated in FIG. 13 can continue to the left and/or to the right. Such configurations allow for larger electrical surge events to occur without damage, as more surge current can be absorbed. As also shown in FIG. 13, the emitter implants 1314a and 1314b are disposed on both sides of the respective base implants 1316a and 1316b (and can surround respective perimeters of the base implants, such as in a racetrack configuration). Such an arrangement can allow the segments of the NPN transistor to efficiently conduct current both to the left and the right, where a corresponding collector implant is disposed adjacent to the emitter and base implants (e.g., with an isolation trench disposed therebetween).

Figure 14:
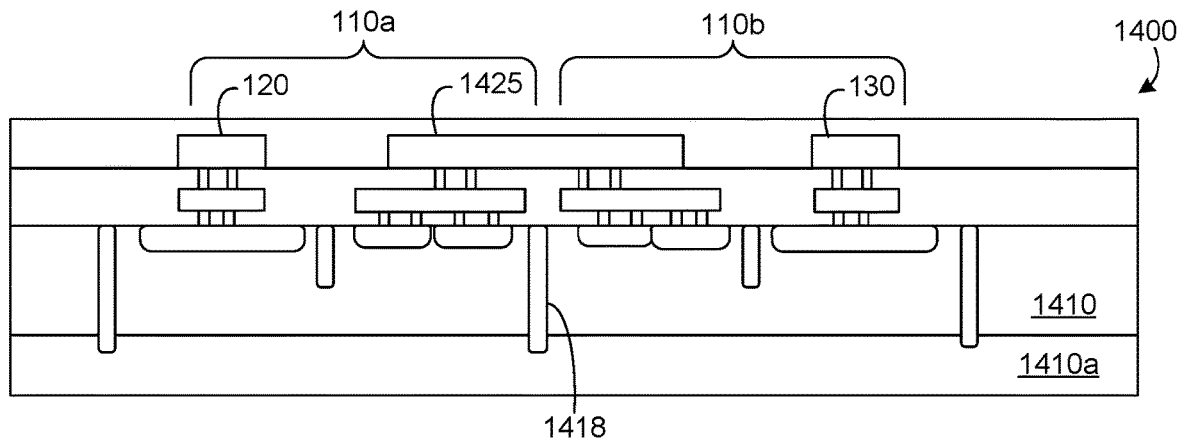

Referring to FIG. 14, a lateral surge protection device 1400 is illustrated that can provide bidirectional surge protection (e.g., protection from both positive and negative electrical surges). As shown in FIG. 14, the lateral surge protection device 1400 includes a first NPN transistor 110a coupled in series with a second NPN transistor 110b, where the collectors and bases of the NPN transistors 110a and 110b are electrically coupled with each other via a node 1425. Such an arrangement can provide for protection from electrical surges from the node 120 to electrical ground 130, or from electrical ground 130 to the node 120. As shown in FIG. 14, to provide electrical isolation (e.g., prevent cross current flow) between the NPN transistors 110a and 110b in a semiconductor layer 1410 (e.g., p-type epitaxial layer), the lateral surge protection device 1400 can include a cell isolation trench 1418 that extends through the semiconductor layer 1410 and into a substrate 1410a (e.g., n-type substrate) on which the semiconductor layer 1410 is disposed.

Figure 15:
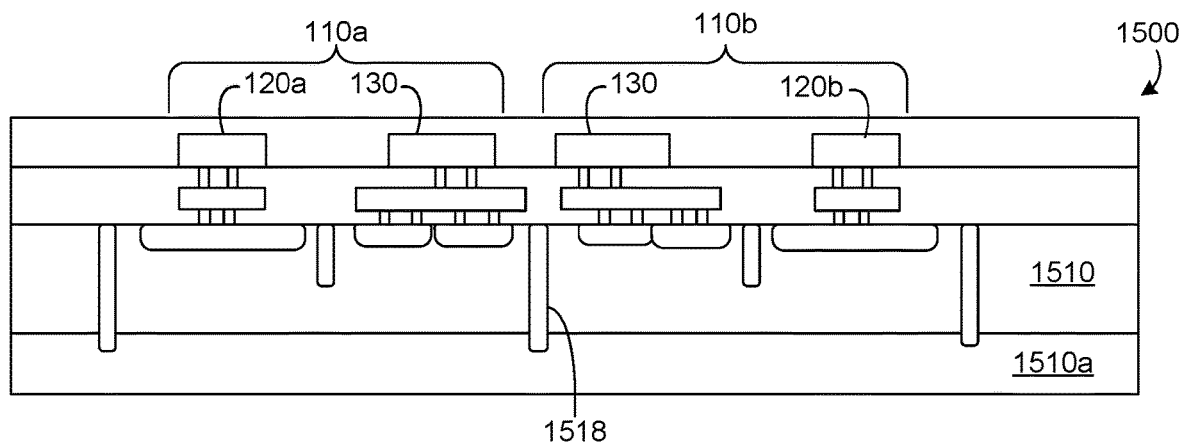

Referring to FIG. 15, a lateral surge protection device 1500 is illustrated that can provide surge protection to multiple nodes 120a and 120b. As shown in FIG. 15, the lateral surge protection device 1500 includes a first NPN transistor 110a coupled between the node 120a and electrical ground 130, and a second NPN transistor 110b coupled between the node 120b and electrical ground 130. As with the lateral surge protection device 1400 shown in FIG. 14, to provide electrical isolation (e.g., prevent cross current flow) between the NPN transistors 110a and 110b in a semiconductor layer 1510 (e.g., a p-type epitaxially layer), the lateral surge protection device 1500 can include a cell isolation trench 1518 that extends through the semiconductor layer 1510 and into a substrate 1510a (e.g., an n-type substrate) on which the semiconductor layer 1510 is disposed.

FIGS. 16-23 illustrate various implementations of lateral surge protection devices implemented as lateral silicon-controlled rectifiers (SCRs), such as variations of the device of FIG. 4. As the implementations of FIGS. 16-23 are variations (including combinations) of the SCR 150 of FIG. 4, for purposes of brevity, the details of the SCR 150 of FIG. 4 are not repeated again with respect to FIGS. 16-23. That is, the discussion of FIGS. 16-23 is directed to differences between the SCR 150 illustrated in FIG. 4 and the implementations of FIGS. 16-23, and/or to combinations of the SCR 150 shown in those drawings. In each of the implementations illustrated in FIGS. 16-23, the node 120 (the protected node) and electrical ground 130 are indicated for reference purposes only, and those connections may not be discussed further. Where multiple nodes are protected by given structures, those nodes are enumerated as node 120a, node 120b, etc.

Figure 16:
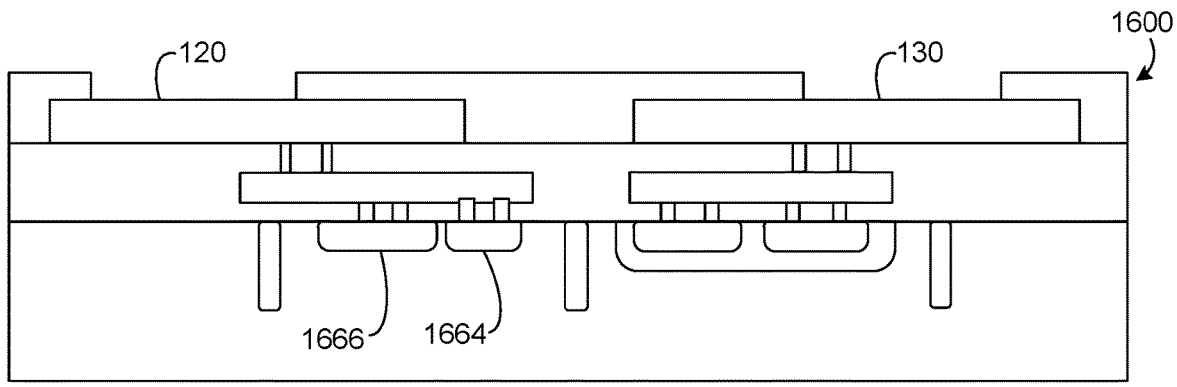
FIGS. 16-23 illustrate various implementations of lateral surge protection devices implemented as lateral silicon-controlled rectifiers (SCRs), such as variations of the device of FIG. 4.

Referring to FIG. 16, a lateral surge protection device 1600 is shown that includes a p-type implant 1664 and a n-type implant 1666. Compared with p-type implant 464 and the n-type implant 466 of the SCR 150, the implants 1664 and 1666 are not disposed in an n-type well. Such an arrangement changes the configuration of the base of the PNP transistor of the SCR 150, which can increase the 13 of the PNP transistor of the SCR. In this example, an associated processing cost can be reduced due to elimination of the n-type well of the implementation of FIG. 4. Such a modification can be made to other SCR implementations as well.

Figure 17:
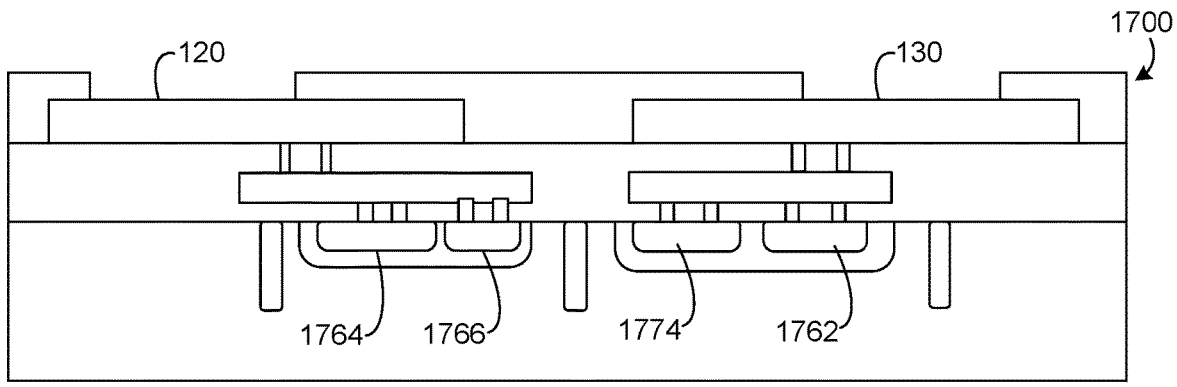
Figure 18:
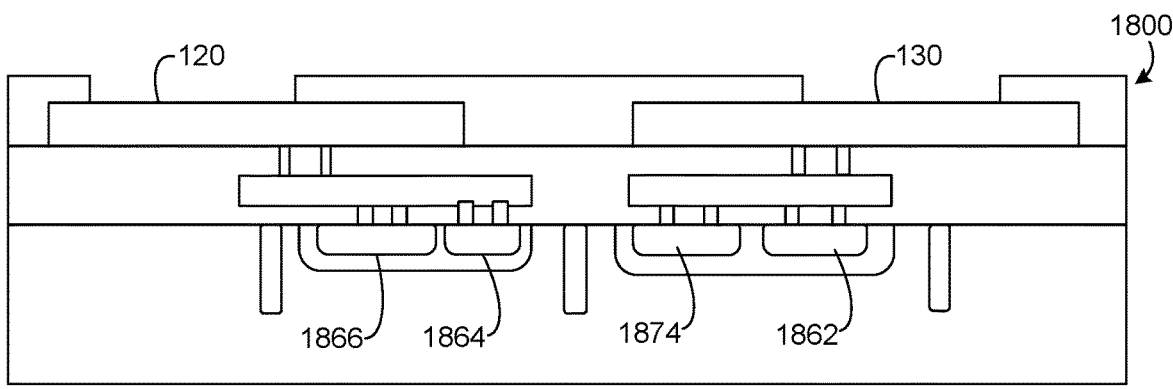
Figure 19:
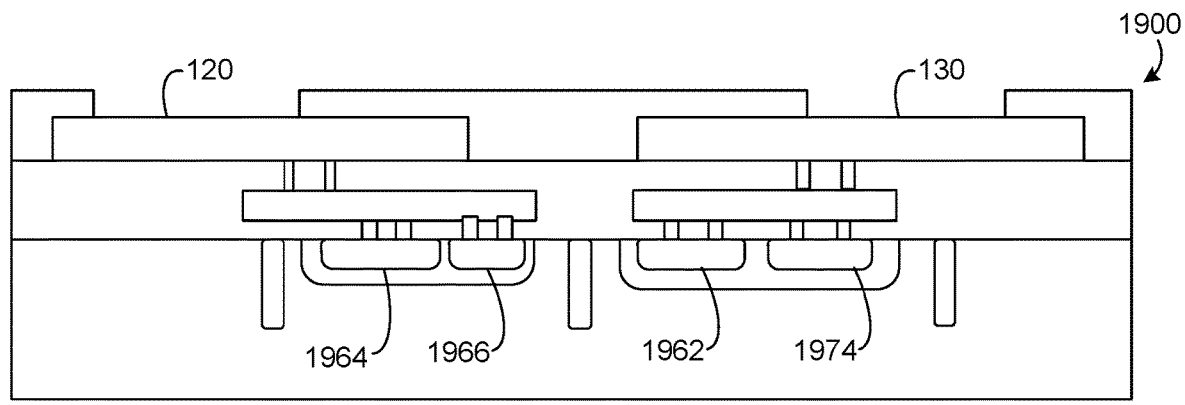

Referring to FIGS. 17-19 as compared to FIG. 3, the various implants of the SCRs are arranged and/or can be differently sized. For instance, in the lateral surge protection device 1700 of FIG. 17 and the lateral surge protection device 1900 of FIG. 19, positions, as well as relative sizes, of respective p-type implants 1764 and 1964, and respective n-type implants 1766 and 1966 are swapped as compared to the implants 464 and 466 of FIG. 3. Further in both FIG. 17, and in the lateral surge protection device 1800 of FIG. 18, positions of respective p-type implants 1762 and 1862, and positions of respective n-type implants 1774 and 1874 are swapped as compared to the implants 462 and 474 of FIG. 3. Such an arrangement can alter the configuration of the respective SCRs, which can change respective betas and base resistances of the NPN transistor and/or the PNP transistor of the illustrate SCRs, which can, in turn, shapes the clamp voltage curves of the devices.

Figure 20:
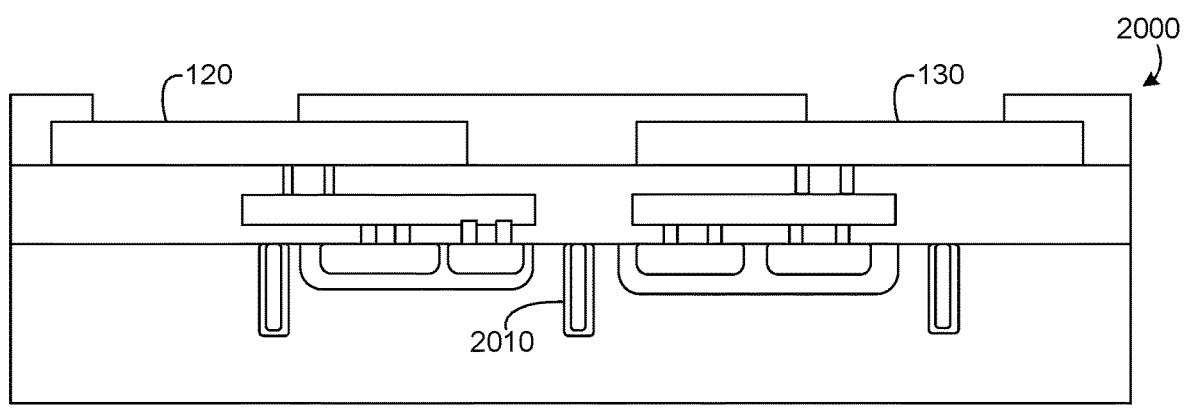

Referring to FIG. 20, a lateral surge protection device 2000 is shown that, similar to the lateral surge protection device 1200 of FIG. 12, includes a heavily doped n-type implant 1210 formed along a sidewall of its isolation trench 2018, which, in some implementations, can reduce leakage of the device 2000 as compared to the device 400.

Figure 21:
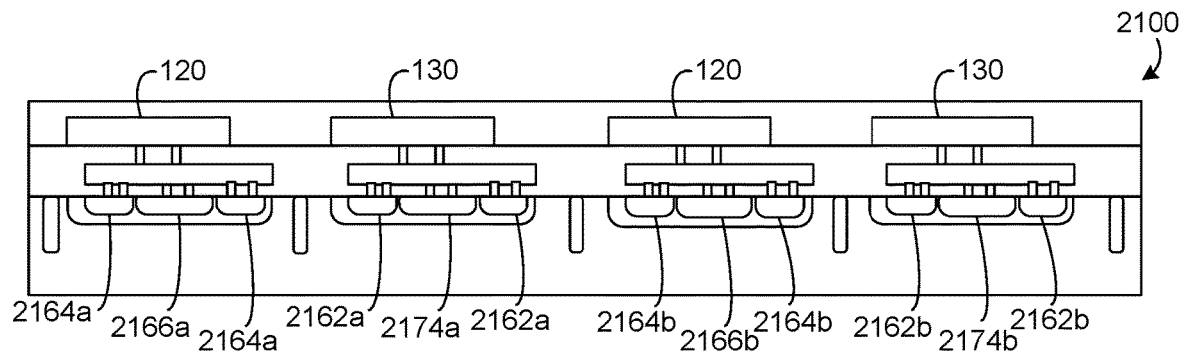

Referring to FIG. 21, a lateral surge protection device 2100 is shown that includes multiple SCR segments that implement a single protection device coupled between the node 120 and electrical ground 130. As shown in FIG. 21, the segments of the lateral surge protection device 2100 include, respectively, implants 2162a and 2162b (corresponding with implant 462), implants 2164a 2164b (corresponding with implant 464), implants 2166a and 2166b (corresponding with implant 466), and implants 2174a and 2174b (corresponding with implant 474). In some implementations, the pattern illustrated in FIG. 21 can continue to the left and/or to the right. Such configurations allow for larger electrical surge events to occur without damage, as more surge current can be absorbed.

As also shown in FIG. 21, the implants 2164a and 2164b are disposed on both sides of the respective implants 2166a and 2116b (and can surround respective perimeters of those implants, such as in a racetrack configuration). Likewise in FIG. 21, the implants 2162a and 2162b are disposed on both sides of the respective implants 2174a and 2174b (and can surround respective perimeters of those implants, such as in a racetrack configuration). Such an arrangement can allow the segments of the SCR to efficiently conduct current both to the left and the right, where a corresponding implant of an SCR segment are disposed adjacently (e.g., with an isolation trench disposed therebetween).

Figure 22:
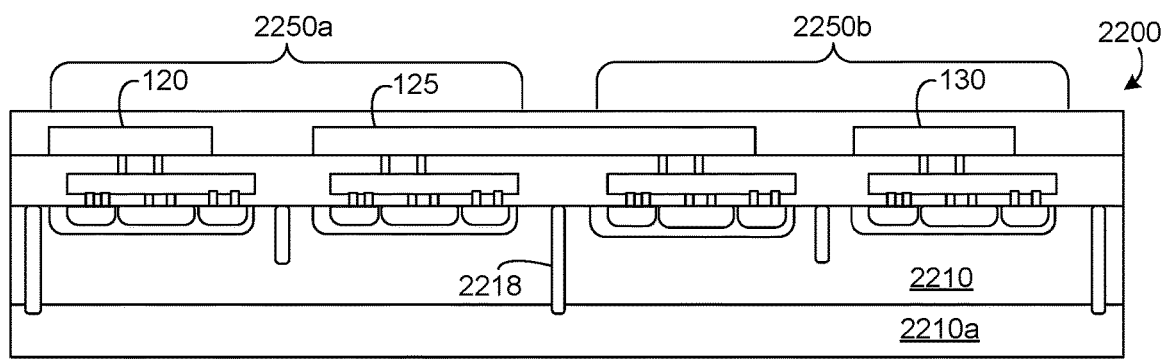

Referring to FIG. 22, a lateral surge protection device 2200 is illustrated that can provide bidirectional surge protection (e.g., protection from both positive and negative electrical surges). As shown in FIG. 21, the lateral surge protection device 2100 includes a first SCR 2250a coupled in series with a second SCR 2250b, where the emitters and bases of the NPN transistors of the SCRs 2250a and 2250b are electrically coupled with each other via a node 125. Such an arrangement can provide for protection from electrical surges from the node 120 to electrical ground 130, or from electrical ground 130 to the node 120. As shown in FIG. 22, to provide electrical isolation (e.g., prevent cross current flow) between the SCRs 2250a and 2250b in a semiconductor layer 2210 (e.g., a n-type epitaxial layer), the lateral surge protection device 2200 can include a cell isolation trench 2218 that extends through the semiconductor layer 2210 and into a substrate 2210a (e.g., a p-type substrate) on which the semiconductor layer 2210 is disposed.

Figure 23:
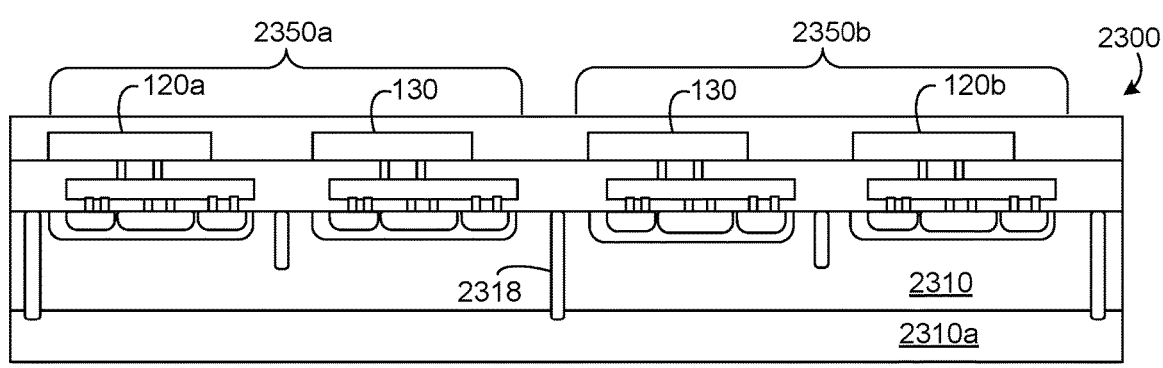

Referring to FIG. 23, a lateral surge protection device 2300 is illustrated that can provide surge protection to multiple nodes 120a and 120b. As shown in FIG. 23, the lateral surge protection device 2300 includes a first SCR 2350a coupled between the node 120a and electrical ground 130, and a second SCR 2350b coupled between the node 120b and electrical ground 130. As with the lateral surge protection device 2200 shown in FIG. 22, to provide electrical isolation (e.g., prevent cross current flow) between the SCRs 2350a and 3250b in a semiconductor layer 2310 (e.g., n-type epitaxial layer), the lateral surge protection device 2300 can include a cell isolation trench 2318 that extends through the semiconductor layer 2310 and into a substrate 2310a (e.g., p-type substrate) on which the semiconductor layer 2310 is disposed.

FIG. 24 is a diagram illustrating a portion (section) of a design layout 2400 of a lateral SCR device, such as the device 2100 shown in FIG. 21, which is a variation of the device 400 of FIG. 4. For purposes of illustration and reference, the elements of FIG. 24 referenced with 2400 series numbers correspond with the elements referenced with 400 series numbers used in FIG. 4. As shown in FIG. 24, the SCR device 2400 includes a p-type well 2463 and an n-type well 2467. The device 2400 further includes an n type implant 2474 surrounded by (e.g., in a racetrack configuration) a p-type implant 2462, which are both disposed in the well 2463. The device 2400 further includes a n-type implant 2466 surrounded by a p-type implant 2464, which are both disposed in the well 2467. An isolation trench 2458 surrounds (e.g., i the well 2467, and is disposed between the wells 2463 and 2467. As also shown in FIG. 24, the SCR includes a cell isolation trench 2418, such as the cell isolation trenches described with respect to FIGS. 14, 15, 22 and 23.

The various apparatus and techniques described herein may be implemented using various semiconductor processing and/or packaging techniques. Some embodiments may be implemented using various types of semiconductor processing techniques associated with semiconductor substrates including, but not limited to, for example, silicon (Si), gallium arsenide (GaAs), silicon carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus comprising:
a semiconductor layer of a first conductivity type;
a lateral bipolar device disposed in the semiconductor layer; and
an isolation trench disposed in the semiconductor layer in a base region of the lateral bipolar device, the isolation trench being disposed between an emitter implant of the lateral bipolar device and a collector implant of the lateral bipolar device, the emitter implant and the collector implant being of a second conductivity type, opposite the first conductivity type, the isolation trench having a depth in the semiconductor layer that is greater than a depth of the emitter implant in the semiconductor layer, and greater than a depth of the collector implant in the semiconductor layer, wherein the isolation trench is not disposed between the emitter implant and a base implant disposed in the semiconductor layer.

2. The apparatus of claim 1, wherein the lateral bipolar device is an NPN transistor.

3. The apparatus of claim 1, wherein the lateral bipolar device is a lateral silicon-controlled rectifier (SCR).

4. The apparatus of claim 3, wherein:
the base region is a first base region of the lateral SCR, the first base region being a base region of a PNP transistor of the lateral SCR; and
the lateral SCR further includes a second base region, the second base region being a base region of a NPN transistor of the lateral SCR.

5. The apparatus of claim 1, wherein the semiconductor layer defines, at least in part, the base region of the lateral bipolar device.

6. The apparatus of claim 1, further comprising:
an implant of the first conductivity type disposed along a sidewall of the isolation trench.

7. The apparatus of claim 1, further comprising at least one of a dielectric or undoped polysilicon disposed within the isolation trench.

8. The apparatus of claim 1, wherein the isolation trench terminates within the semiconductor layer.

9. An apparatus comprising:
a semiconductor layer of p-type conductivity;
a lateral NPN transistor disposed in the semiconductor layer, the lateral NPN transistor including:
a collector implant disposed in the semiconductor layer, the collector implant being of n-type conductivity;
an emitter implant disposed in the semiconductor layer, the emitter implant being of n-type conductivity; and
a base implant disposed in the semiconductor layer adjacent to the emitter implant, the base implant being of p-type conductivity; and
an isolation trench disposed in the semiconductor layer in a base region of the lateral NPN transistor, the isolation trench being disposed between the collector implant and the emitter implant, and disposed between the collector implant and the base implant, wherein the isolation trench is not disposed between the emitter implant and the base implant, the isolation trench having a depth in the semiconductor layer that is greater than a depth of the emitter implant in the semiconductor layer, and greater than a depth of the collector implant in the semiconductor layer.

10. The apparatus of claim 9, wherein the emitter implant is disposed between the isolation trench and the base implant.

11. The apparatus of claim 9, wherein the base implant is disposed between the isolation trench and the emitter implant.

12. The apparatus of claim 9, further comprising:
a first signal metal electrically coupled with the emitter implant and the base implant;
a second signal metal electrically coupled with the first signal metal;
a third signal metal electrically coupled with the collector implant; and
a fourth signal metal electrically coupled with the third signal metal.

13. The apparatus of claim 9, wherein the lateral NPN transistor is a first lateral NPN transistor, the collector implant is a first collector implant, the emitter implant is a first emitter implant, and the base implant is a first base implant,
the apparatus further comprising a second lateral NPN transistor including:
a second collector implant disposed in the semiconductor layer, the second collector implant being of n-type conductivity;
a second emitter implant disposed in the semiconductor layer, the second emitter implant being of n-type conductivity;
a second base implant disposed in the semiconductor layer adjacent to the emitter implant, the second base implant being of p-type conductivity; and
a second isolation trench disposed in the semiconductor layer in a base region of the second lateral NPN transistor, the second isolation trench being disposed between the second collector implant and the second emitter implant, and disposed between the second collector implant and the second base implant.

14. The apparatus of claim 13, wherein the first lateral NPN transistor and the second lateral NPN transistor are, respectively, a first segment and a second segment of a same NPN transistor.

15. The apparatus of claim 13, wherein the first emitter implant, the first base implant, the second emitter implant, and the second base implant are electrically coupled to each other via at least a first signal metal.

16. An apparatus comprising:
a semiconductor layer of n-type conductivity;
a lateral silicon-controlled rectifier (SCR) disposed in the semiconductor layer, the lateral SCR including:
a first p-type implant disposed in the semiconductor layer, the first p-type implant being included in an emitter of a PNP transistor of the lateral SCR;
a first n-type implant disposed in the semiconductor layer, the first n-type implant being included in a base of the PNP transistor and a collector of an NPN transistor of the lateral SCR;
a second p-type implant disposed in the semiconductor layer, the second p-type implant being included in a collector of the PNP transistor and a base of the NPN transistor; and
a second n-type implant disposed in the semiconductor layer, the second n-type implant being included in an emitter of the NPN transistor; and
an isolation trench disposed in the semiconductor layer in a base region of the PNP transistor and a collector region of the NPN transistor, at least a portion of the semiconductor layer being included in the base region of the PNP transistor and the collector region of the NPN transistor, wherein the isolation trench is not disposed between the second p-type implant and the second n-type implant, the isolation trench having a depth in the semiconductor layer that is greater than a depth of the first p-type implant in the semiconductor layer, greater than a depth of the first n-type implant in the semiconductor layer, greater than a depth of the second p-type implant in the semiconductor layer, and greater than a depth of the second n-type implant in the semiconductor layer.

17. The apparatus of claim 16, further comprising:

a n-type well disposed in the semiconductor layer, the first p-type implant and the first n-type implant being disposed in the n-type well, the n-type well being included in the base of the PNP transistor and the collector of the NPN transistor; and a p-type well disposed in the semiconductor layer, the second p-type implant and the second n-type implant being disposed in the p-type well, the p-type well being included in the collector of the PNP transistor and the base of the NPN transistor, the isolation trench being disposed between the n-type well and the p-type well.

18. The apparatus of claim 16, wherein the lateral SCR is a first lateral SCR, the PNP transistor is a first PNP transistor, the NPN transistor is a first NPN transistor, and the isolation trench is a first isolation trench, the apparatus further comprising a second lateral SCR including:

a third p-type implant disposed in the semiconductor layer, the third p-type implant being included in an emitter of a second PNP transistor, the second PNP transistor being included in the second lateral SCR;

a third n-type implant disposed in the semiconductor layer, the third n-type implant being included in a base of the second PNP transistor and a collector of a second NPN transistor, the second NPN transistor being included in the second lateral SCR;

a fourth p-type implant disposed in the semiconductor layer, the fourth p-type implant being included in a collector of the second PNP transistor and a base of the second NPN transistor;

a fourth n-type implant disposed in the semiconductor layer, the fourth n-type implant being included in an emitter of the second NPN transistor; and a second isolation trench disposed in the semiconductor layer in a base region of the second PNP transistor and a collector region of the second NPN transistor, at least a portion of the semiconductor layer being included in the base region of the second PNP transistor and the collector region of the second NPN transistor.

19. The apparatus of claim 18, wherein the first lateral SCR and the second lateral SCR are, respectively, a first segment and a second segment of a same SCR.

20. The apparatus of claim 18, wherein the second p-type implant, the second n-type implant, the fourth p-type implant, and the fourth n-type implant are electrically coupled to each other via at least a first signal metal.

* * * * *